US008314055B2

(12) United States Patent
Mui et al.

(10) Patent No.: US 8,314,055 B2
(45) **Date of Patent: *Nov. 20, 2012**

(54) MATERIALS AND SYSTEMS FOR ADVANCED SUBSTRATE CLEANING

(75) Inventors: David S. L. Mui, Fremont, CA (US); Ji Zhu, El Cerrito, CA (US); Arjun Mendiratta, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/503,486

(22) Filed: Jul. 15, 2009

(65) Prior Publication Data

US 2010/0016202 A1 Jan. 21, 2010

Related U.S. Application Data

(63) Continuation-in-part of application No. 12/131,654, filed on Mar. 2, 2008, now Pat. No. 8,211,846.

(51) Int. Cl.
*C11D 7/32* (2006.01)

(52) U.S. Cl. .......................... 510/175; 510/176; 510/177

(58) Field of Classification Search .................. 510/175
See application file for complete search history.

(56) References Cited

U.S. PATENT DOCUMENTS

2006/0186089 A1 * 8/2006 Shida et al. ..................... 216/88
2007/0290166 A1 * 12/2007 Liu et al. ...................... 252/79.2

* cited by examiner

*Primary Examiner* — Necholus Ogden, Jr.
(74) *Attorney, Agent, or Firm* — Martine Penilla Group, LLP

(57) ABSTRACT

The embodiments of the present invention provide improved materials, apparatus, and methods for cleaning wafer surfaces, especially surfaces of patterned wafers (or substrates). The cleaning materials, apparatus, and methods discussed have advantages in cleaning patterned substrates with fine features without substantially damaging the features. The cleaning material includes polymers of one or more polymeric compounds. The cleaning materials can be used in a wide range of viscosity and pH to clean different types of surfaces. The cleaning materials are in liquid phase, and deform around device features to capture the contaminants on the substrate. The polymers entrap the contaminants preventing their return to the substrate surface. The cleaning apparatus is designed to dispense and rinse cleaning materials with a range of viscosities.

15 Claims, 14 Drawing Sheets

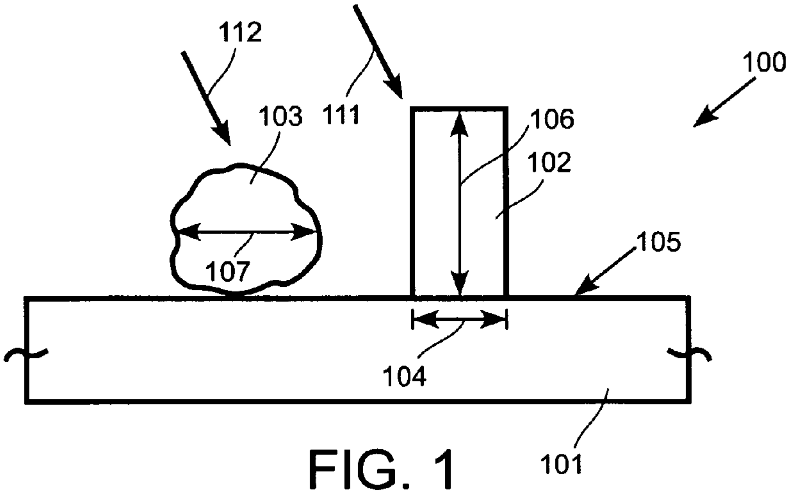
FIG. 1
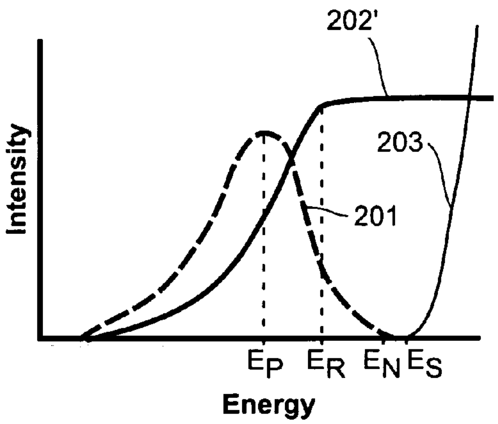
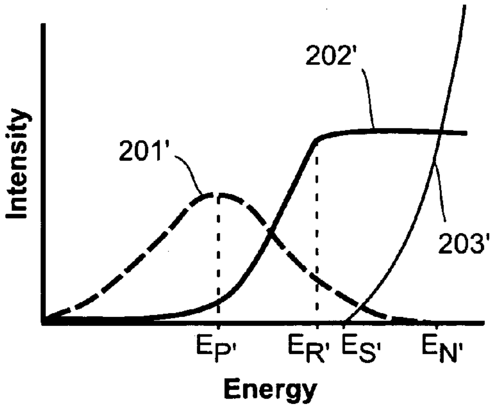
FIG. 2A
FIG. 2B

MATERIALS AND SYSTEMS FOR ADVANCED SUBSTRATE CLEANING

CLAIM OF PRIORITY

This application is a continuation-in-part under U.S.C. §120 of U.S. patent application Ser. No. 12/131,654, filed Jun. 2, 2008 now U.S. Pat. No. 8,211,846, entitled "Materials for Particle Removal by Single-Phase and Two-Phase Media," and U.S. patent application Ser. No. 12/131,667, filed on Jun. 2, 2008, entitled "Apparatus for Particle Removal by Single-Phase and Two-Phase Media." The disclosure of each of the above-identified applications is incorporated herein by reference.

RELATED APPLICATION

This application is related to U.S. patent application Ser. No. 12/431,731, filed on Apr. 28, 2009, entitled "Apparatus and System for Cleaning Substrate." The disclosure of the above-identified application is incorporated herein by reference.

BACKGROUND

In the fabrication of semiconductor devices, such as integrated circuits, memory cells, and the like, a series of manufacturing operations are performed to define features on semiconductor wafers ("wafers"). The wafers (or substrates) include integrated circuit devices in the form of multi-level structures defined on a silicon substrate. At a substrate level, transistor devices with diffusion regions are formed. In subsequent levels, interconnect metallization lines and vias are patterned and electrically connected to the transistor devices to define a desired integrated circuit device. Patterned conductive layers are insulated from other conductive layers by dielectric materials.

During the series of manufacturing operations, the wafer surface is exposed to various types of contaminants. Essentially any material present in a manufacturing operation is a potential source of contamination. For example, sources of contamination may include process gases, chemicals, deposition materials, and liquids, among others. The various contaminants may deposit on the wafer surface in particulate form. If the particulate contamination is not removed, the devices within the vicinity of the contamination will likely not operate as desired. Because the size of particulate contamination that would cause the failure of devices is on the order of the critical dimension size of features fabricated on the wafer (or greater), removal of small particulate contamination without damaging the features on the wafer can be quite difficult for advanced technology nodes with fine feature sizes.

Conventional wafer cleaning methods have relied heavily on mechanical force to remove particulate contamination from the wafer surface. As feature sizes continue to decrease and become more fragile, the probability of feature damage due to application of mechanical forces on the wafer surface increases. For example, fine features having high aspect ratios are vulnerable to toppling or breaking when impacted by a sufficient mechanical force. To further complicate the cleaning problem, the move toward reduced feature sizes also causes a reduction in the tolerable size of particulate contamination. Particulate contamination of sufficiently small size can find its way into difficult to reach areas on the wafer surface, such as in a trench surrounded by high aspect ratio features. Thus, efficient and damage-free removal of contaminants during modem semiconductor fabrication represents a continuing challenge to be met by advanced wafer cleaning technology. It should be appreciated that the manufacturing operations for flat panel displays also suffer from the same shortcomings of the integrated circuit manufacturing discussed above.

In view of the forgoing, there is a need for materials, apparatus and methods of cleaning patterned wafers that are effective in removing contaminants without damage of the features on the patterned wafers.

SUMMARY

The embodiments of the present invention provide improved materials, apparatus, and methods for cleaning wafer surfaces, especially surfaces of patterned wafers (or substrates). The cleaning materials, apparatus, and methods discussed have advantages in cleaning patterned substrates with fine features without substantially damaging the features. The cleaning material includes polymers of one or more polymeric compounds dissolved in a solvent. The cleaning materials are in liquid phase, and deform around device features; therefore, the cleaning materials do not substantially damage the device features if at all. The polymers of the cleaning materials capture the contaminants on the substrate. In addition, the polymers entrap the contaminants preventing their return to the substrate surface. The cleaning materials can be used to clean different types of substrate surfaces, including hydrophilic, hydrophobic, and mixed hydrophobic and hydrophilic surfaces. The formulation windows and process windows for the cleaning materials are widened to allow a formulated cleaning material be used to clean different types of substrate surfaces. The cleaning apparatus can be designed to dispense and rinse cleaning materials with a range of viscosities.

The polymers can be cross-linked. However, the extent of cross-link is relatively limited to avoid making the polymers too hard or rigid, which would prevent the polymers from being soluble in a solvent and being deformed around device features on the substrate surface.

It should be appreciated that the present invention can be implemented in numerous ways, including as a system, a method and a chamber. Several inventive embodiments of the present invention are described below.

In one embodiment, a cleaning material applied on a surface of a patterned substrate for defining integrated circuit devices to remove contaminants from the surface is provided. The cleaning material includes a solvent, and polymers of one or more polymeric compounds. The one or more polymeric compounds are dissolved in the solvent. The solubilized polymers have long polymer chains, which capture and entrap at least some of the contaminants from the surface of the patterned substrate for defining integrated circuit devices. The cleaning material is defined as a liquid phase. The viscosity of the cleaning material is between about 100 cP to about 10,000 cP measured at a reference shear rate less than about 100/s. The cleaning material deforms around device features on the surface of the patterned substrate when a force is applied on the cleaning material covering the patterned substrate.

In another embodiment, a cleaning material applied on a surface of a patterned substrate for defining integrated circuit devices to remove contaminants from the surface is provided. The cleaning material includes a solvent, and a buffering agent to change a potential of hydrogen (pH) value of the cleaning material, wherein the buffering agent and the solvent form a cleaning solution. The cleaning material also includes polymers of one or more polymeric compounds being dissolved in the cleaning solution. The cleaning material has the pH between about 7 and about 12. The solubilized polymers have long polymer chains to capture and entrap at least some of the contaminants from the surface of the patterned substrate for defining integrated circuit devices. The cleaning material is defined as a liquid phase. The viscosity of the cleaning material is between about 100 cP to about 10,000 cP measured at a reference shear rate. The cleaning material deforms around device features on the surface of the patterned substrate when a force is applied on the cleaning material covering the patterned substrate. The cleaning material further includes a surfactant to assist dispersing the polymers in the cleaning material and to assist wetting the surface of the patterned substrate. In addition, the cleaning material includes an ion-providing compound, which ionizes in the cleaning solution to adjust the viscosity of the cleaning material.

BRIEF DESCRIPTION OF THE DRAWINGS

The present invention will be readily understood by the following detailed description in conjunction with the accompanying drawings, and like reference numerals designate like structural elements.

FIG. 1 shows a defect and device feature on a substrate, in accordance with one embodiment of the present invention.

FIG. 2A shows a diagram of 3 response curves related to applying a cleaning material on a patterned substrate, in accordance with one embodiment of the present invention.

FIG. 2B shows a diagram of 3 response curves related to applying a cleaning material on a patterned substrate.

DETAILED DESCRIPTION

Figure 2C:
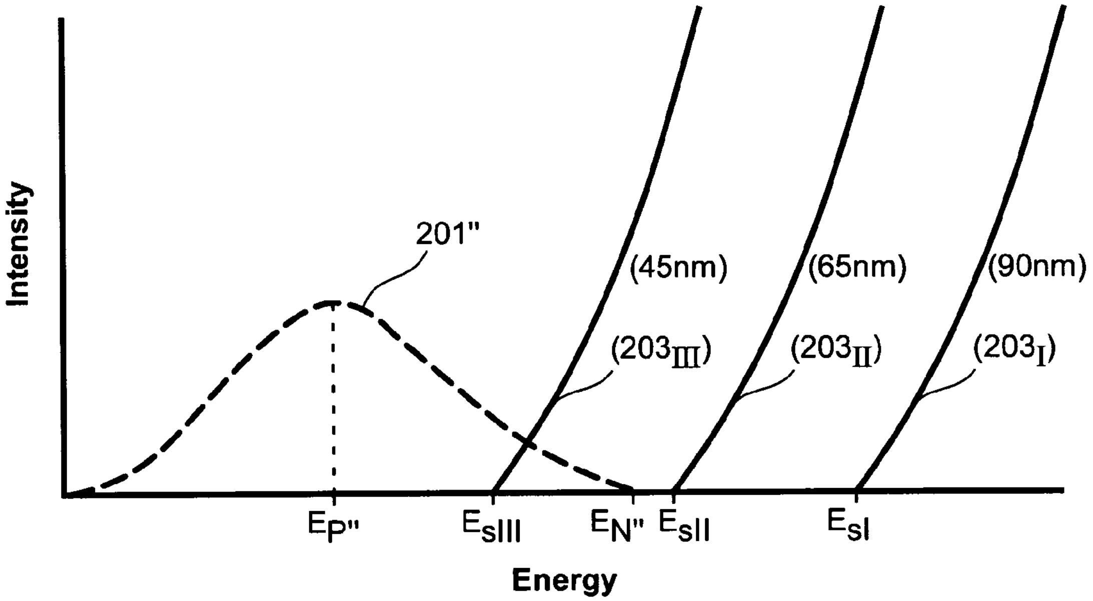
FIG. 2C shows a diagram of 3 damage curves for different technology nodes and a force intensity curve of a cleaning material, in accordance with one embodiment of the present invention.

Embodiments of materials, apparatus, and methods for cleaning wafer surfaces, especially surfaces of patterned wafers (or substrates), are provided. The cleaning materials, apparatus, and methods discussed have advantages in cleaning patterned substrates with fine features without substantially damaging the features. In one embodiment, a cleaning material includes polymers of one or more polymeric compounds dissolved in a solvent. The cleaning materials are in liquid phase, and deform around device features; therefore, the cleaning materials do not substantially damage the device features or reduce damage all together. The polymers of the cleaning materials capture the contaminants on the substrate. In addition, the polymers entrap the contaminants preventing their return to the substrate surface. The cleaning materials can be used to clean different types of substrate surfaces, including hydrophilic and hydrophobic surfaces. The formulation windows and process windows for the cleaning materials are widened to allow a formulated cleaning material be used to clean different types of substrate surfaces. The cleaning apparatus can be designed to dispense and rinse cleaning materials with a range of viscosities. The polymers form long polymer chains, which can also be cross-linked to form a network (or polymeric network). The long polymer chains and/or polymer network show superior capabilities of capturing and entrapping contaminants, in comparison to conventional cleaning materials.

In another embodiment, the cleaning material also contains a buffering agent to modify the pH of the cleaning material. The cleaning material further contains a surfactant to assist dispersing the polymers in the solvent and to assist wetting the surface of the patterned substrate. In addition, the cleaning material contains an ion-providing compound to modify the viscosity of the cleaning material.

It will be obvious, however, to one skilled in the art, that the present invention may be practiced without some or all of these specific details. In other instances, well known process operations have not been described in detail in order not to unnecessarily obscure the present invention.

The embodiments described herein provide cleaning materials and cleaning methods that are effective in removing contaminants and do not damage the features on the patterned wafers, some of which may contain high aspect ratio features. While the embodiments provide specific examples related to semiconductor cleaning applications, these cleaning applications might be extended to any technology requiring the removal of contaminants from a substrate.

FIG. 1 shows a substrate 100 with a substrate body 101, in accordance with one embodiment of the present invention. On substrate 101 there is a device structure 102 and a particle 103 in the vicinity of surface 105. Particle 103 has an approximate diameter 107, which can be in the same order of magnitude as the width 104 of device structure 102.

For advanced technologies, such as 65 nm, 45 nm, 32 nm, 22 nm, and, 16 nm technology nodes, the width 104 of the device structure 102 is equal to or less than 65 nm. The widths of device structures, such as width 104 of device structure 102, are scaled continuously down with each technology node to fit more devices on the limited surface area of chips. The heights of the device structures, such as height 106 of device structure 102, in general do not scale down proportionally with the width of the device features due to concern of high resistivities. For conductive structures, such as polysilicon lines and metal interconnect, narrowing the widths and heights of structures would increase the resistivity so much as to cause significant RC delay and generate too much heat for the conductive structures. As a result, device structures, such as structure 102, would have high aspect ratio, which make them prone to damage by force 111 applied on the structure. In one embodiment, the aspect ratio of the device structure can be in the range of about 2 or greater. Force 112 is applied on particle 103 to assist in removing particle 103. Forces 111 and 112 are applied by cleaning material (not shown) on the substrate surface near device structure 102 to remove surface particulates, such as particle 103. In one embodiment, forces 111 and 112 are very close in magnitude, since they are in the vicinity of each other. Forces 111, 112 applied on the substrate surface could be from any relative motion between the cleaning material and the substrate surface. For example, it can be from dispensing of cleaning material or rinsing of the cleaning material.

The decreased width 104 of device structure 102 and the relatively high aspect ratio of device structure 102 make the device structure 102 prone to breakage under applied force 111 or accumulated energy under applied force 111. The damaged device structure 102 becomes a particle source to reduce yield. In addition, the damage device structure 102 also can become inoperable due to the damage.

FIG. 2A shows a diagram of 3 response curves related to applying a cleaning material on a patterned substrate, in accordance with one embodiment of the present invention. Curve 201 shows intensity versus energy (as a result of force) exerted by a cleaning material on the substrate surface. The intensity of cleaning energy exerted by the cleaning material peaks at $E_P$. Curve 202 shows particle removal efficiency as a function of energy applied on the substrate by the cleaning material. The particle removal rate peaks at near $E_R$. When the energy exerted by the cleaning material reaches $E_R$, the cleaning material is most efficient at removing particles from the substrate surface. Curve 203 shows the amount of damages of device structures caused by the cleaning material as a function of energy applied on the substrate surface by the cleaning material. The device structures become damaged at $E_S$, which is higher than the higher end, $E_N$, of energy exerted by the cleaning material on the substrate. Since the device structure damage curve 203 is outside the energy distribution 201 of the cleaning material exerts on the pattern substrate, the device structures on the pattern substrate would not be damaged. The particle removal curve 202 shows that the cleaning material can remove particles (or contaminants) from the substrate surface without damaging structures on the substrate.

FIG. 2B shows a diagram of 3 response curves related to applying a cleaning material on a patterned substrate. Curve 201' shows intensity versus energy exerted by a cleaning material on a patterned substrate. The intensity exerted by the cleaning material peaks at $E_P'$. Curve 202' shows particle removal rate versus energy applied on the substrate. The particle removal rate peaks at near $E_R'$. When the energy exerted by the cleaning material reaches $E_R'$, the cleaning material is most efficient at removing particles from the substrate surface. Curve 203' shows the amount of damages of device structures caused by the cleaning material as a function of energy applied on the substrate surface by the cleaning material. The device structures on the substrate become damaged at $E_S'$, which is lower than the higher end, $E_N'$, of energy distribution of energy exerted by the cleaning material. Since the device structure damage curve 203' is within the energy distribution 201' of the cleaning material exerts on the pattern substrate, the device structures on the pattern substrate would be damaged by the cleaning material to add particles (or defects).

As mentioned above, damaging device structures during a cleaning process could render the device inoperable and damaged device structures could stay on the substrate surface to reduce device yield. Therefore, the relationship between the cleaning curve 201' and damage curve 203' of FIG. 2B is undesirable. In contrast, the relationship between the cleaning curve 201 and damage curve 203 of FIG. 2A is desirable.

Conventional substrate cleaning apparatus and methods include brushes and pads utilizing mechanical forces in removing particulates from the substrate surface. For advanced technologies with device structures with narrow widths and high aspect ratios, the mechanical forces applied by the brushes and pads can damage the device structures. In addition, the harsh brushes and pads may also cause scratches on the substrate surface. Cleaning techniques, such as megasonic cleaning and ultrasonic cleaning, utilizing cavitation bubbles and acoustic streaming to clean substrate can also damage fragile structures. Cleaning techniques using jets and sprays can cause erosion of films and can also damage fragile structures.

FIG. 2C shows a cleaning curve 201" for a conventional cleaning material applied by a conventional method, such as megasonic cleaning, in accordance with one embodiment of the present invention. There are damage curves $\mathbf{203}_I$, $\mathbf{203}_{II}$, and 203$_{III}$ for three technology nodes, 90 nm, 65 nm, and 45 nm, respectively. The onset of damage starts at energy $E_{SI}$ for curve 203$_{I}$ for patterned wafers for 90 nm technology node. $E_{SI}$ is larger than the upper end $E_N$" of energy distribution of the cleaning material on the patterned substrate. Therefore, there is no damage to the device structures. The conventional cleaning material of FIG. 2C still works for 65 nm technology node, since the onset of damage starts at $E_{SII}$, which is higher than EN". As technology moves into narrower width, the onset of damage starts at lower energy level. When the technology node becomes 45 nm or lower, the conventional cleaning material and method of curve 201" would cause damage to device structures. The onset of damage for 45 nm technology node, $E_{SIII}$ is lower than the EN". FIG. 2C shows that although some cleaning materials and methods work for conventional technologies, they no longer work for advanced technologies with narrower feature widths. Therefore, there is a need to find a cleaning mechanism using a cleaning material that is gentler to the device structures and is effective in removing particles from the substrate surface.

Figure 3A:
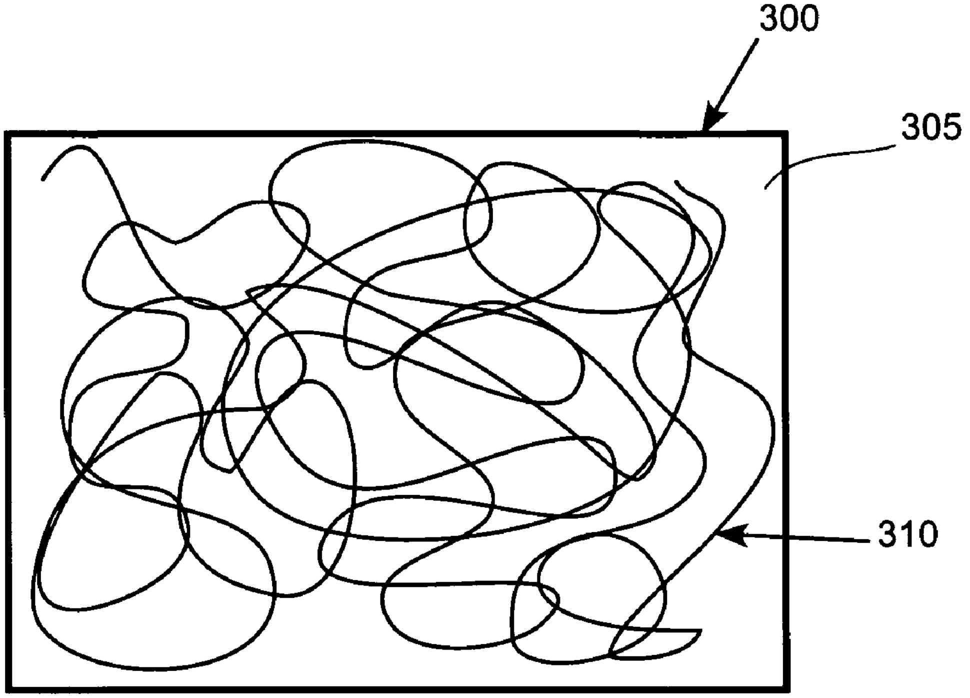
FIG. 3A shows a cleaning material containing polymers of a polymeric compound with large molecular weight dissolved in the cleaning solution, in accordance with one embodiment of the present invention.
Figure 3B:
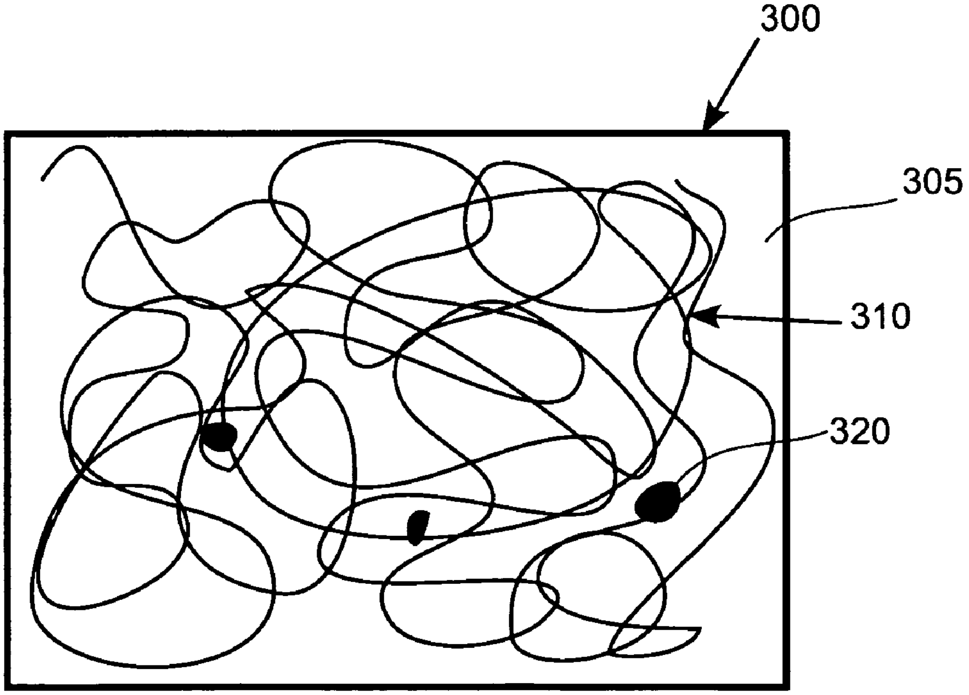
FIG. 3B shows the cleaning material of FIG. 3A entrapping contaminants, in accordance with one embodiment of the present invention.

FIG. 3A shows a liquid cleaning material 300, which contains polymers 310 with large molecular weight(s) dissolved in a solvent 305, in accordance with one embodiment of the present invention. In one embodiment, the liquid cleaning material 300 is a gel. In another embodiment, the liquid cleaning material 300 is a sol. In yet another embodiment, the liquid cleaning material 300 is a liquid solution. The liquid cleaning material 300, when applied on a substrate with particles on the substrate surface, can remove particles on the substrate surface. In one embodiment, the removed particles 320 are attached to the polymers 310, as shown in FIG. 3B. The polymers have a large molecular weight(s). In one embodiment, the molecular weight(s) of the polymers is greater than about 10,000 g/mol. The polymers form long polymer chains to capture and trap the removed particles to prevent the particles from returning back to the substrate surface. In one embodiment, the polymer chains form a polymeric network. In one embodiment, the polymers 310 are either acidic or basic. The polymer 310, when dissolved in water, gives a solution with a hydrogen ion activity (pH) lower or greater than in pure water, i.e. a pH larger than or less than 7.0. In another embodiment, the cleaning material 300 also contains a buffering agent that helps adjusting and maintaining the pH of the cleaning material.

The polymers dissolved in the solvent can be a soft gel or become gel-like droplets suspended in the solvent. In one embodiment, the contaminants on the substrate surface attach to the solvated polymers by ionic force, van der Waals force, electrostatic force, hydrophobic interaction, steric interaction, or chemical bonding when the polymer molecules come in vicinity of the contaminants. The polymers capture and entrap the contaminants.

As mentioned above, the polymers could form a network in the solvent 305. The polymers are dispersed in the liquid solvent 305. The liquid cleaning material 300 is gentle on the device structures on the substrate during cleaning process. The polymers 310 in the cleaning material 300 can slide around the device structures, such as structure 302, as shown in cleaning volume 330 of FIG. 3C, without making a forceful impact on the device structure 302. In contrast, hard brushes, and pads mentioned above would make unyielding contacts with the device structures and damage the device structures. Forces (or energy) generated by cavitation in megasonic cleaning and high-speed impact by liquid during jet spray can also damage the structure. Alternatively, more than one type of polymers can be dissolved in the solvent to formulate the cleaning material. For examples the polymers in the cleaning material can include an "A" polymeric compound and a "B" polymeric compound.

The polymers of one or more polymeric compounds with high molecular weights form long chains of polymers, with or without cross-linking to from a polymeric network. As discussed above, the polymers can be cross-linked. However, the extent of cross-link is relatively limited to avoid making the polymers too hard or rigid, which would prevent the polymers from being soluble in a solvent and being deformed around device features on the substrate surface.

Figure 3C:
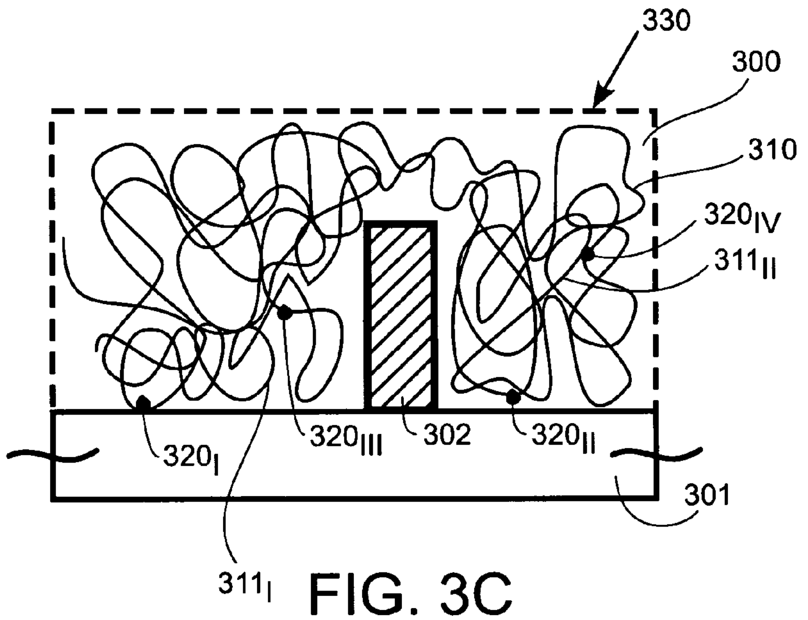
FIG. 3C shows the cleaning material of FIG. 3A dispensed on a patterned wafer to clean contaminants from the substrate surface, in accordance with one embodiment of the present invention.

As shown in FIG. 3C, the polymers 310 come in contact with the contaminants, such as contaminants 320$_{I}$, 320$_{II}$, 320$_{III}$, 320$_{IV}$ on the patterned (or un-patterned) substrate surface and capture contaminants. After the contaminants are captured by the polymers, they become attached to the polymers and are suspended in the cleaning material. FIG. 3C shows that contaminants 320$_{III}$, and 320$_{IV}$ which are attached to the polymer chain(s) 311$_{I}$, and 311$_{II}$, respectively. Contaminants 320$_{I}$ and 320$_{II}$ are attached to other polymer chains. Alternatively, contaminants, 320$_{I}$, 320$_{II}$, 320$_{III}$, and 320$_{IV}$, can each be attached to multiple polymer chains, or be attached to a polymeric network. When the polymers in the cleaning material 300 are removed from the substrate surface, such as by rinsing, the contaminants attached to the polymers chains are removed from the substrate surface along with the polymer chains.

Figure 3D:
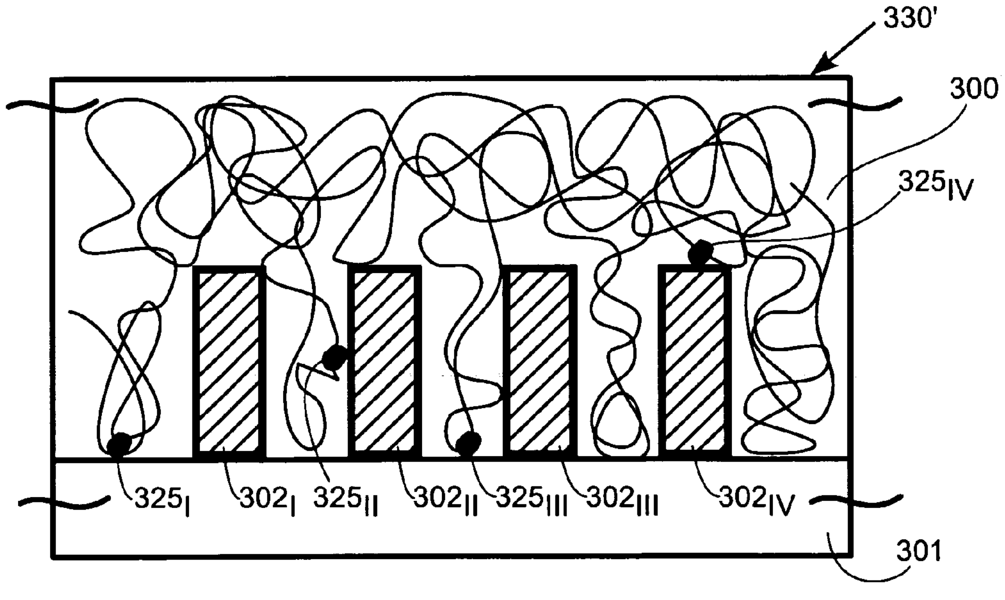
FIG. 3D shows the cleaning material of FIG. 3A dispensed on a patterned wafer to clean contaminants from the substrate surface, in accordance with another embodiment of the present invention.

The embodiment shown in FIG. 3C shows only one device structure 302. On a substrate, such as substrate 301, a number of device structures, such as 302$_{I}$, 302$_{II}$, 302$_{III}$, and 302$_{IV}$, can be clustered to be next to one another as shown in FIG. 3D, in accordance with one embodiment of the present invention. Similar to FIG. 3C, the liquid cleaning material 300, in the cleaning volume 330', is gentle on the device structures on the substrate during cleaning process. The polymers 310 in the cleaning material 300 slides around the device structures, 302$_{I}$, 302$_{II}$, 302$_{III}$, and 302$_{IV}$, without making a forceful impact on the device structures. Similar to the contaminants, 320$_{I}$, 320$_{II}$, 320$_{III}$, and 320$_{IV}$ of FIG. 3C being attached to polymer chains, contaminants, 325$_{I}$, 325$_{II}$, 325$_{III}$, and 325$_{IV}$, are also attached to polymers chains.

Figure 3E:
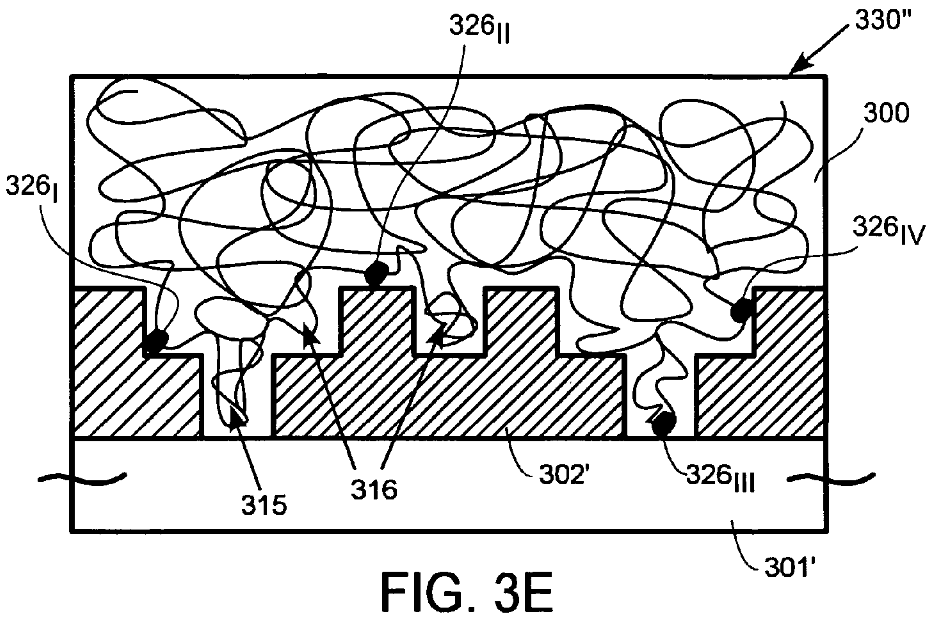
FIG. 3E shows the cleaning material of FIG. 3A dispensed on a patterned wafer with trenches and vias to clean contaminants from the substrate surface, in accordance with one embodiment of the present invention.

In addition to cleaning substrate with lines features, such as the ones in FIGS. 3C and 3D, substrates with other patterned features can also be cleaned by the materials and methods described in the current invention. FIG. 3E shows a substrate 301' with structures 302' that forms vias 315 and trenches 316, in accordance with one embodiment of the present invention. Contaminants 326$_{I}$, 326$_{II}$, 326$_{III}$, and 326$_{IV}$ can also be removed by cleaning material 300 by mechanisms discussed above in FIGS. 3C and 3D.

As described above, the polymers of one or more polymeric compounds with large molecular weights are dispersed in the solvent. Examples of the polymeric compound with large molecular weight include, but not limited to, acrylic polymers such as polyacrylamide (PAM), and polyacrylic acid (PAA), such as Carbopol 940™ and Carbopol 941™, poly-(N,N-dimethyl-acrylamide) (PDMAAm), poly-(N-isopropyl-acrylamide) (PIPAAm), polymethacrylic acid (PMAA), polymethacrylamide (PMAAm); polyimines and oxides, such as polyethylene imine (PEI), polyethylene oxide (PEO), polypropylene oxide (PPO) etc; vinyl polymers such as polyvinyl alcohol (PVA), polyethylene sulphonic acid (PESA), polyvinylamine (PVAm), polyvinyl-pyrrolidone (PVP), poly-4-vinyl pyridine (P4VP), etc; cellulose derivatives such as methyl cellulose (MC), ethyl-cellulose (EC), hydroxyethyl cellulose (HEC), carboxymethyl cellulose (CMC), etc; polysaccharides such as acacia (gum arabic), agar and agarose, heparin, guar gum, xanthan gum, etc., and proteins such as albumen, collagen, gluten, etc. To illustrate a few examples of the polymer structure, polyacrylamide is an acrylate polymer (—$CH_2CHCONH_2$—)n formed from acrylamide subunits. Polyvinyl alcohol is a polymer (—$CH_2CHOH$—)m formed from vinyl alcohol subunits. Polyacrylic acid is a polymer (—$CH_2$═CH—COOH—)o formed from acrylic acid subunits. "n", "m", and "o" are integers. The polymers of one or more polymeric compounds with large molecular weights either are soluble in an aqueous solution or are highly water-absorbent to form a soft gel in an aqueous solution. As mentioned above, in one embodiment, the molecular weights of the one or more polymeric compounds are greater than 10,000 g/mol. In another embodiment, the molecular weights of the one or more polymeric compounds are greater than 100,000 g/mol. In another embodiment, the molecular weights of the one or more polymeric compounds are between about 0.01M g/mol to about 100M g/mol. In another embodiment, the molecular weights of the one or more polymeric compounds are between about 0.1M g/mol to about 50M g/mol. In yet another embodiment, the molecular weights of the one or more polymeric compounds are between about 1M g/mol to about 20M g/mol. In yet another embodiment, the molecular weights of the one or more polymeric compounds are between about 15M g/mol to about 20M g/mol. The weight percentage of the polymers in the cleaning material is between about 0.001% to about 20%, in one embodiment. In another embodiment, the weight percentage is between about 0.001% to about 10%. In another embodiment, the weight percentage is between about 0.01% to about 10%. In yet another embodiment, the weight percentage is between about 0.05% to about 5%. The polymers can dissolve in the solvent, be dispersed completely in the solvent, form liquid droplets (emulsified) in the solvent, or form globs (or lumps) in the solvent.

Alternatively, the polymers can be copolymers, which are derived from two or more monomeric species. For example, the copolymers can include 90% of PAM and 10% of PAA made from monomers for PAM and PAA. Other concentrations of ingredients of copolymers are also possible. In addition, the polymers can be a mixture of two or more types of polymers. For example, the polymers can be made by mixing two types of polymers, such as 90% of PAM and 10% of PAA, in the solvent. Using copolymers or a mixture of different polymers in the cleaning materials has the advantage of utilizing the different strengths of the different polymers to achieve best cleaning results.

In the embodiments shown in FIG. 3A-3C, polymers of one or more polymeric compounds with large molecular weights are dissolved uniformly in the solvent. The solvent can be a non-polar liquid, such as turpentine, or a polar liquid, such as water ($H_2O$). Other examples of solvent include isopropyl alcohol (IPA), dimethyl sulfoxide (DMSO), and dimethyl formamide (DMF). In one embodiment, the solvent is a mixture of two or more liquids. For polymers with polarity, such as PAM, PAA, or PVA, the suitable solvent is a polar liquid, such as water ($H_2O$).

The polymers used in the cleaning materials can be acidic or basic. For example, polymers containing acrylic acid unit are acidic and a mixture of PAA in water can give a pH value of about 3. Examples of basic polymer include polymers containing quaternary ammonium salts such as poly(diallyldimethylammonium chloride) or tertiary amines such as polyethyleneimine (PEI). 50 wt % PEI and water mixture can give a pH value of approximately 12.

To adjust (or modify) the properties of a cleaning material, additives can be mixed in the cleaning material. Additive(s) can be mixed with the solvent to become a cleaning solution before the polymers are added. For example, the additive can be a buffering agent, which can be a weak acid or a weak base, to adjust the potential of hydrogen (pH) value of the cleaning material. One example of a weak acid to be used as a buffering agent is citric acid. One example of a weak base to be used as a buffering agent is ammonium hydroxide ($NH_4OH$).

The pH values of the cleaning materials can be between about 1 to about 12. In one embodiment, for front-end applications (before the deposition of copper and inter-metal dielectric), the cleaning material is basic. The pH values of cleaning materials for front-end applications are between about 7 to about 12, in one embodiment. In another embodiment, the pH values of cleaning materials for front-end applications are between about 7 to about 10. For backend processing (after deposition of copper and inter-metal dielectric), the cleaning solution is slightly basic, neutral, or acidic, in one embodiment. Copper in the backend interconnect is not compatible with a cleaning material containing ammonium hydroxide as a buffering agent. Ammonium hydroxide interacts with copper and dissolves copper. The pH values for backend applications are between about 1 to about 7, in one embodiment. In another embodiment, the pH values for backend applications are between about 1 to about 5. In yet another embodiment, the pH values for backend applications are between about 1 to about 2. However, if the buffering agent is not ammonium hydroxide, the pH range for backend application can be widened. In one embodiment, the pH values for backend applications are between about 1 to about 12.

In another embodiment, the additives of the cleaning material include a surfactant, such as ammonium dodecyl sulfate (ADS), to assist dispersing the polymers in the cleaning solution. In one embodiment, the surfactant also assists wetting of the cleaning material on the substrate surface. Wetting of the cleaning material on the substrate surface allows the cleaning material to come in close contact with the substrate surface and the particles on the substrate surface. Wetting improves cleaning efficiency. Other additives can also be added to improve surface wetting, viscosity, substrate cleaning, rinsing, and other related properties.

Examples of buffered cleaning solution (or cleaning solution) include a buffered ammonium hydroxide solution (BAS), which include basic and acidic buffering agents, such as 0.44 wt % of $NH_4OH$ and 0.4 wt % of citric acid, in the solution. Alternatively, the buffered solution, such as BAS, includes some amount of a surfactant, such as 1 wt % of ADS, to help suspend and disperse the polymers in the cleaning solution. A solution that contains 1 wt % of ADS, 0.44 wt % of NH3, and 0.4 wt % of citric acid is called solution "100". Both solution "100" and BAS have a pH value of about 10.

Figure 3F:
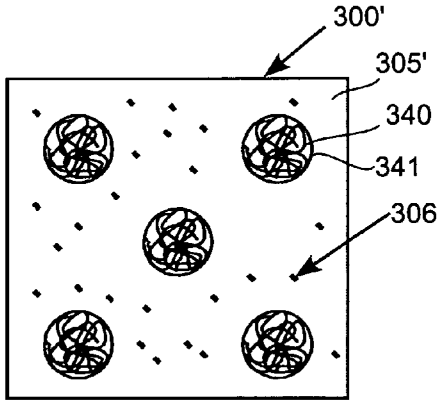
FIG. 3F shows a cleaning material with gel-like polymer droplets emulsified in the cleaning solution, in accordance with one embodiment of the present invention.

The embodiments shown in FIGS. 3A-3E provide a liquid cleaning material 300 that has the polymers 310 with large molecular weight dispersed (or dissolved) uniformly in the cleaning solution 305. As described above, polymers with large molecular weight for this application are completely dissolved in the cleaning solution, which can be aqueous. The polymers are highly water-absorbent to form soft gel in an aqueous solution. FIG. 3F shows an embodiment of a liquid cleaning material 300' with gel-like polymer droplets 340 emulsified in the cleaning solution 305'. The cleaning solution 305' also contains small and isolated polymer 306. A surfactant, such as ADS, could be added to the cleaning solution to help the gel-like polymer droplets 340 disperse uniformly in the cleaning solution 305'. In the embodiment shown in FIG. 3F, there is a boundary 341 between the cleaning solution 305' and the gel-like polymer droplets 340. The gel-like polymer droplets 340 are soft and deform around device features on the substrate surface. Since the gel-like polymer droplets 340 deform around device features, they do not exert large energy (or force) on the device features to damage them. In one embodiment, the diameters of the droplets are between about 0.1 μm to about 100 μm.

Figure 3G:
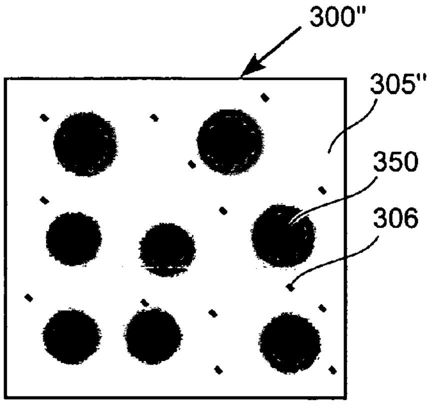
FIG. 3G shows a cleaning material with gel-like polymer globs suspended in the cleaning solution, in accordance with one embodiment of the present invention.

In another embodiment, the polymers of one or more polymeric compounds with large molecular weights dissolve in the cleaning solution to form gel-like polymer globs (or lumps) 350, which do not establish a distinct boundary with the cleaning solution 305'', as shown in FIG. 3G. The cleaning solution 305'' also contains small and isolated polymers 306. The gel-like polymer globs 350 are soft and deform around device features on the substrate surface, and do not exert large amount of energy (or force) to the device features on the substrate surface, which would damage them. In one embodiment, the diameters of the polymer globs are between about 0.1 μm to about 100 μm.

Figure 3H:
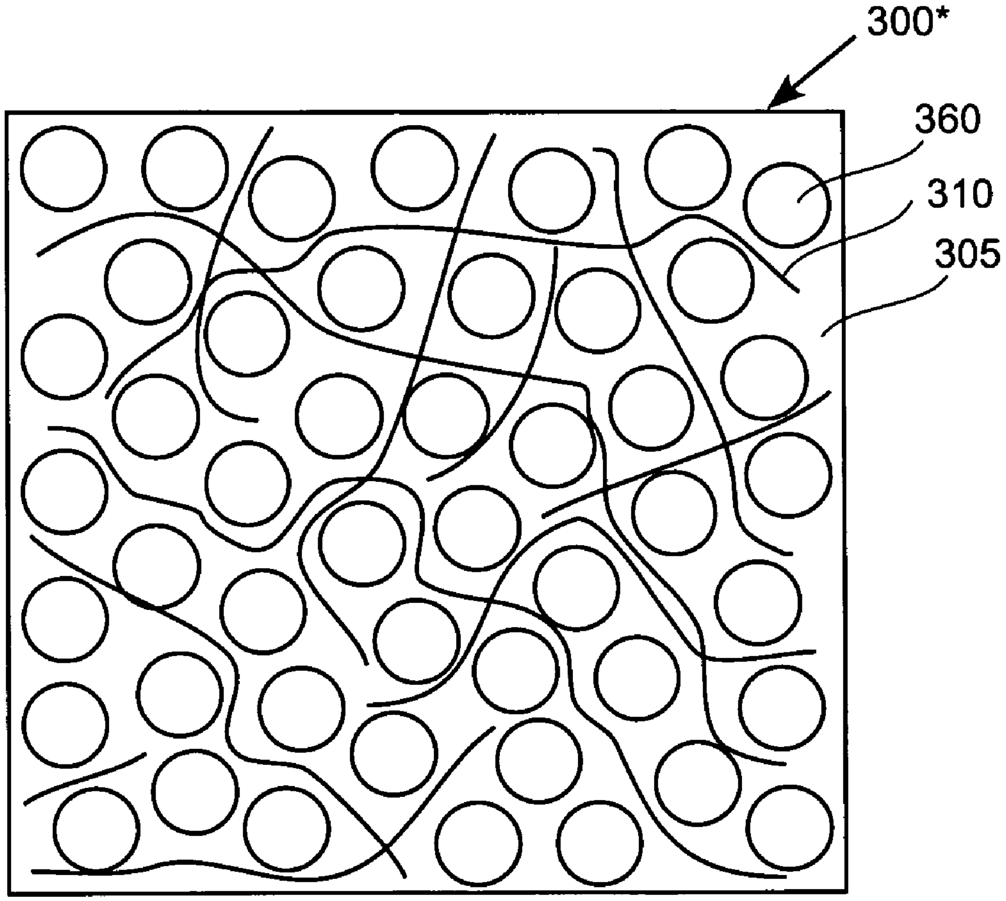
FIG. 3H shows a foam cleaning material, in accordance with one embodiment of the present invention.

The cleaning materials discussed above are all in the liquid phase. In yet another embodiment, the cleaning material, such as liquid cleaning materials 300, 300', and 300' discussed above, can be agitated to add a gas, such as $N_2$, an inert gas, or a mixture of gases, such as air, to make the cleaning material into a foam, as shown in FIG. 3H. In FIG. 3H, the cleaning material 300* has air bubbles 360 dispersed in the cleaning solution 305. Polymers 310 are also dispersed in the cleaning solution 305. In other embodiments, the polymers 310 in FIG. 3H can be polymer droplets 340 or polymer globs 350, described in FIGS. 3F and 3G. The cleaning material 300* has a gas phase and a liquid phase.

The cleaning material described above can be dispensed by many mechanisms on the substrate surface. As discussed above in FIGS. 2A and 2B, to avoid damaging device features on the patterned substrates, the energy applied by the cleaning material on the patterned surface needs to be below the minimum force $E_S$ or $E_S'$ to avoid damaging the device features. The cleaning materials, such as cleaning materials 300, 300', 300'', and 300*, discussed above are either in liquid phase or in gas/liquid phases. Liquid and foam can flow on the substrate surface and deform (or flow) around the device features on the substrate surface. Therefore, the cleaning material can be applied on the patterned substrate without exerting large force on the device features on the substrate surface.

Table I compares the viscosity, rinse time, and particle removal efficiency (PRE) of different weight percent of Carbopol 941™ PAA in BAS. Viscosity of liquid cleaning materials can be measured in a range of shear rate, such as between about $1\times10^{-6}$/s to about $1\times10^{5}$/s. In one embodiment, the viscosity of the liquid cleaning material can be measured at a reference shear rate less than about 100/s. In another embodiment, the viscosity can be measured at a reference shear rate less than about 10/s. In yet another embodiment, the viscosity can be measured at a reference shear rate less than about 1/s. The viscosity data in Table I are measured at strain rate of 500 $s^{-1}$. The rinse time measures the time it takes to rinse the cleaning material off the substrate surface. The PRE is measured by using particle monitor substrates, which are purposely deposited with silicon nitride particles with varying sizes. In this study, only particle sizes between 90 nm and 1 μm are measured. PRE is calculated by equation (1) listed below:

$$PRE=(\text{Pre-clean counts}-\text{Post-clean counts})/\text{Pre-clean counts}\times100\% \quad (1)$$

TABLE I

Comparison of cleaning materials with different concentration of Carbopol 941 ™ PAA polymers

| Concentration (wt %) | Polymer molecular weight (g/mol) | Viscosity @ 500 $s^{-1}$ (cP) | Rinse Time (seconds) | PRE |
|---|---|---|---|---|
| 0.2% | 1.25M | 26 | <5 | 74% |
| 0.5% | 1.25M | 198 | 5-10 | 89% |
| 1% | 1.25M | 560 | 8-10 | 87% |

The cleaning materials of Table I are made by mixing Carbopol 941™ PAA, which is commercially available, with BAS as described above. The Carbopol 941™ PAA used has a molecular weight of 1,250,000 (or 1.25M) g/mol. The results in Table I show that PRE increases with weight % of Carbopol 941™ PAA until about 0.5%. There is no significant difference in PRE between 0.5% and 1% of polymers. The results also show that the viscosity of the cleaning material increases with the weight percentage of the polymers. In addition, the rinse time it takes to rinse off the cleaning material increases with the viscosity of the cleaning material. Water is used to rinse the substrates.

Table II compares the ability of different cleaning materials in entrapping or suspending particles in the cleaning materials. Silicon nitride particles are purposely added into the cleaning materials. After being added with silicon nitride particles, the cleaning materials are dispensed on clean substrates. The cleaning materials are then rinse off of the substrate, which is then measured for the number of particles (silicon nitride) remaining on the surface.

TABLE II

Comparison of particle counts with different cleaning materials added with silicon nitride particles.

| Cleaning Material w/1X SiN particles | Particle counts after rinsing | Cleaning Material w/50X SiN particles | Particle counts after rinsing |
|---|---|---|---|
| DIW | Saturated | DIW | Saturated |
| DIW + ammonium hydroxide (pH > 10) | 6002 | DIW + ammonium hydroxide (pH > 10) | Saturated |
| "100" | 4238 | "100" | Saturated |
| 0.2% Carbopol 940 ™ in "100" | 1137 | 0.2% Carbopol 940 ™ in "100" | 15689 |
| 0.5% PAM in "100" | 53 | 0.5% PAM in "100" | 104 |

Five types of cleaning materials (solvent or solutions) are used in the study of Table II. The first cleaning material, "DIW", is only de-ionized water. The second cleaning material is DIW added with ammonium hydroxide to adjust the pH value to be greater than 10. The third cleaning material is solution "100", which is BAS added with 1 wt % of ADS. As mentioned above, the pH value of solution "100" is 10. The fourth cleaning material is 0.2 wt % of Carbopol 940™ PAA dissolved in "100" solution. The molecular weight of Carbopol 940™ PAA is 4M (or 4 million) g/mol. The fifth type is 0.5 wt % of PAM dissolved in solution "100". The molecular weight of PAM is 18M g/mol. The pH value of the fifth cleaning material is about 10. The five types of cleaning materials are mixed with two quantities of silicon nitride particles, 1X, and 50X. The number of silicon nitride particles of 50X is fifty times the number of particles of 1X. 1X nitride particles represent the nitride particle weight % is 0.00048%, while 50X nitride particle represent the nitride particle weight % is 0.024%.

The results show that DIW is not very good at suspending silicon nitride particles. Large amount of silicon nitride particles (saturated) are left on the substrate surface. The description of "saturated" used in Table II describes particle (or defects) counts of greater than 75,000. In contrast, 0.2% Carbopol 940™ PAA in "100" and 0.5% PAM in "100" are much better at suspending silicon nitride particles in the cleaning material. 0.5% PAM in "100" is especially good at entrapping or suspending silicon nitride particles added to the cleaning material. Only small numbers, 53 for 1X silicon nitride particles, and 104 for 50X silicon nitride particles, of silicon nitride (or $Si_3N_4$) panicles in the cleaning material are left on the substrate surface.

Figure 4A:
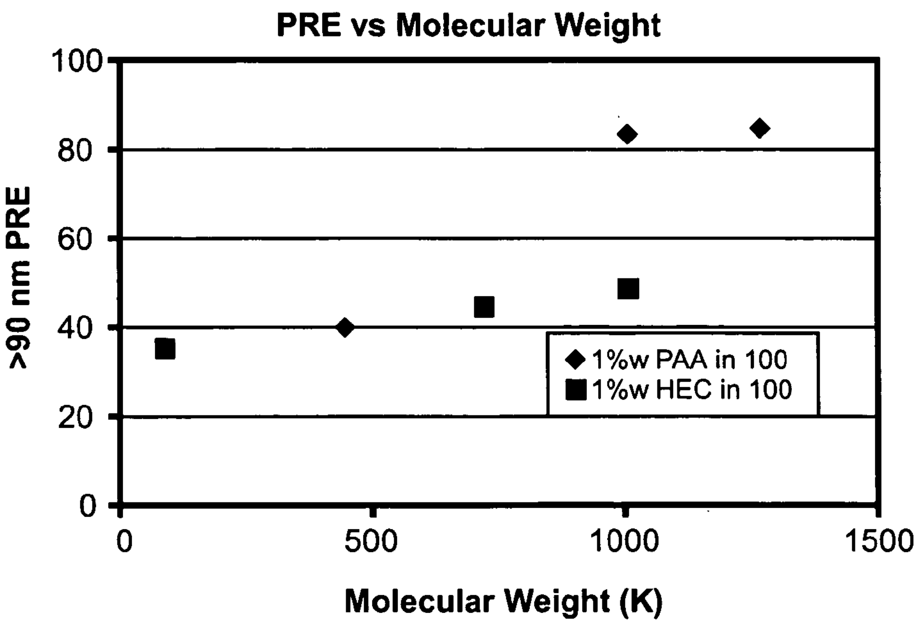
FIG. 4A shows particle removal efficiency (PRE) as a function of molecular weight for polyacrylic acid (PAA) and hydroxyethyl cellulose (HEC), in accordance with one embodiment of the present invention.
Figure 4B:
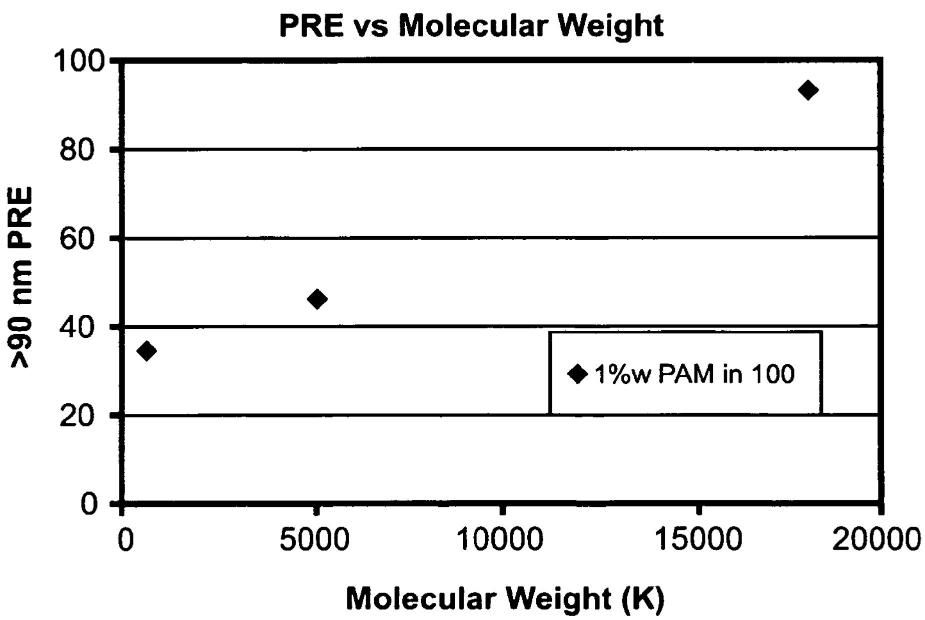
FIG. 4B shows PRE as a function of molecular weight for polyacrylamide (PAM), in accordance with one embodiment of the present invention.

The molecular weight of polymers used in the cleaning material can affect the particle removal efficiency (PRE). FIG. 4A shows a graph of PRE of greater than 90 nm silicon nitride particles on a substrate by cleaning materials with 1% (weight %) of PAA in "100" and 1% (weight %) of hydroxyethyl cellulose (HEC) in "100" as a function of the molecular weight of these two polymers (PAA and HEC). The data in FIG. 4A show that PRE increases with molecular weight of HEC between 100,000 g/mol to 1M (or 1,000,000) g/mol. Data in FIG. 4A also show that PRE increases with molecular weight for PAA between 500,000 g/mol and 1M g/mol. However, PRE does not change much between 1M g/mol and 1.25M g/mol for PAA. FIG. 4B shows a graph of PRE of greater than 90 nm silicon nitride particles on a substrate by cleaning materials with 1% (weight %) of PAM in "100" as a function of the molecular weight of PAM. The data in FIG. 4B show that increasing the PRE increases with molecular weight of PAM between 500,000 g/mol to 18M g/mol. Data in both graphs show the effects of molecular weight on PRE.

Figure 4C:
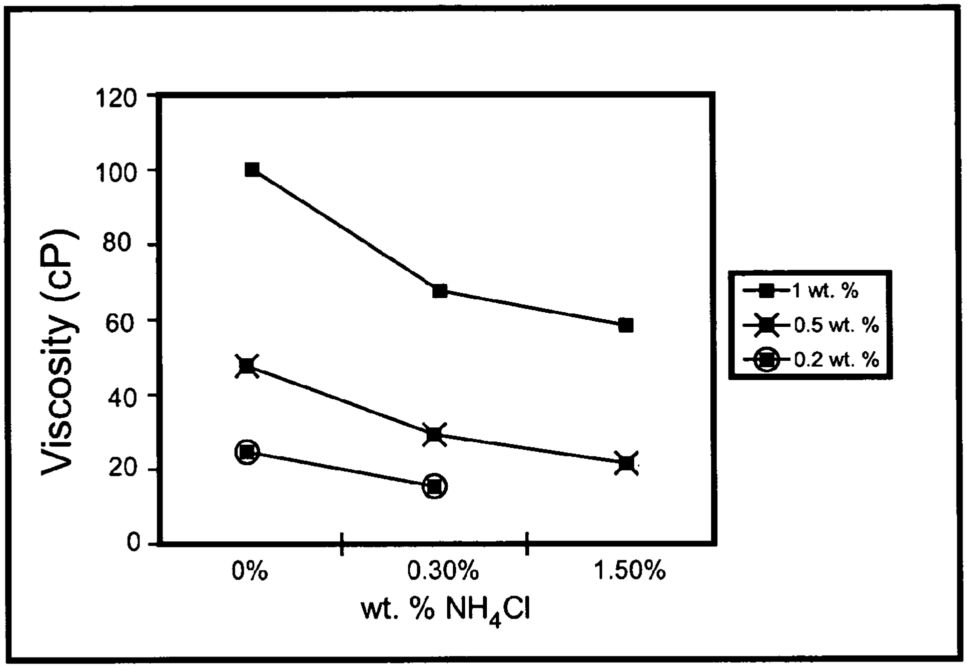
FIG. 4C shows experimental results of using ammonium chloride to reduce viscosity of cleaning material made with polyacrylamide (PAM) polymers, in accordance with one embodiment of the present invention.

As mentioned above, the viscosity of the cleaning material would affect the rinsing time to remove the cleaning material from the substrate surface. FIG. 4C shows the results of adding ammonium chloride ($NH_4Cl$) to cleaning material with 0.2 wt %–1 wt % of PAM dissolved in de-ionized (DI) water. The PAM has a molecular weight of 18M g/mol. The added ammonium chloride ionizes in the cleaning solution to provide additional ions increasing the ionic strength of the cleaning material. The increased ionic strength reduces the viscosity of the cleaning material. For example, 1.5 wt % of ammonium chloride is able to reduce the viscosity from about 100 cP (centipoises) to 60 cP for cleaning material with 1 wt % PAM. 1.5 wt % of ammonium chloride is also able to reduce the viscosity for cleaning material with 0.5 wt % PAM from about 50 cP to about 25 cP. These viscosities were measured at a shear rate of 500/s. Lowering the viscosity could lower the amount of time it takes to rinse the cleaning material from the substrate surface.

In addition to affecting the rinse time of cleaning materials, viscosity also affects how the cleaning materials are dispensed on substrate surface. Cleaning materials with higher viscosities would need to be dispensed with larger openings in comparison to cleaning materials with lower viscosities. Rinse time for cleaning materials with higher viscosities can also be reduced by more rigorous rinsing.

Table III compares PRE, pH values, and ionic strengths data for four formulations of cleaning materials. The polymers in all four cleaning materials are copolymers of acrylaride and acrylic acid. The copolymers are mixed in solution "100." Ammonium hydroxide is used to adjust the pH values of the cleaning materials. Citric acid is used to modify the ionic strengths of the cleaning materials. In addition to the buffering agent (ammonium hydroxide) and ionic strength adjuster (citric acid), the cleaning materials in Table III also include a small amount of surfactant, ammonium dodecyl sulfate, to improve solubility of polymers in the cleaning solution and improve wetting of the cleaning materials on substrate surfaces. The weight percentage of acrylic acid in the copolymers is less than about 50%.

TABLE III

Comparison of data of PRE, pH, and ionic strength for 4 formulations of cleaning materials.

| Formulation | PRE | pH | ionic strength |
|---|---|---|---|
| #1 | 97% | 7 | 1X |
| #2 | 98% | 10 | 1X |
| #3 | 95% | 7 | 0.15X |
| #4 | 91% | 10 | 0.15X |

The data in Table III show that the four different types of cleaning materials all have very good PRE. The pH values for the cleaning materials in Table III vary between about 7 to about 10. The ionic strengths for the cleaning materials vary from about 0.15X to about 1X, where X is a set value. The viscosities of cleaning materials with 0.15X ionic strengths are more than 5 times the viscosities of cleaning materials with 1X ionic strengths. The viscosity data of the cleaning materials on Table III are presented and discussed below in FIG. 4D. The cleaning materials yield very good cleaning efficiencies over wide ranges of pH values, ionic strengths and viscosities. Such wide process windows are important, since during different process steps of device manufacturing substrate surfaces might be very different and requires wide process conditions. For example, the wafers used in the study of Table III are made of silicon covered by a thin layer of native oxide. The surfaces of these wafers are hydrophilic. For hydrophilic substrate surfaces, the cleaning materials have large formulation (or process) windows. However, when such wafers are treated with an HF solution, the surfaces become hydrophobic. Table IV shows data of particle adders on hydrophobic wafer surfaces after the wafers are treated with three different formulations of cleaning materials. The chemical compounds (or ingredients) used in formulating cleaning materials in Table IV are the same as those used in Table III. The wafers in the study of Table IV are exposed to the formulations and additional particle defects resulted from the exposure are measured by a commercial light scattering tool and classified as adders. The fewer the particle defects added the better the process will be. In Table IV, 95% CI represents 95% confidence interval. Numerous wafers are processed to obtain the data with 95% CI.

TABLE IV

Comparison of data of particle adders, pH, and ionic strength for 3 formulations of cleaning materials.

| Formulation | >65 nm adders (95% CI) | >50 nm adders (95% CI) | pH | ionic strength |
|---|---|---|---|---|
| A | 271 ± 61 | 695 ± 125 | 10 | 1X |
| B | 90 ± 39 | 177 ± 53 | 10 | 0.15X |
| C | 24 ± 6 | 51 ± 14 | 7 | 0.15X |

Figure 4D:
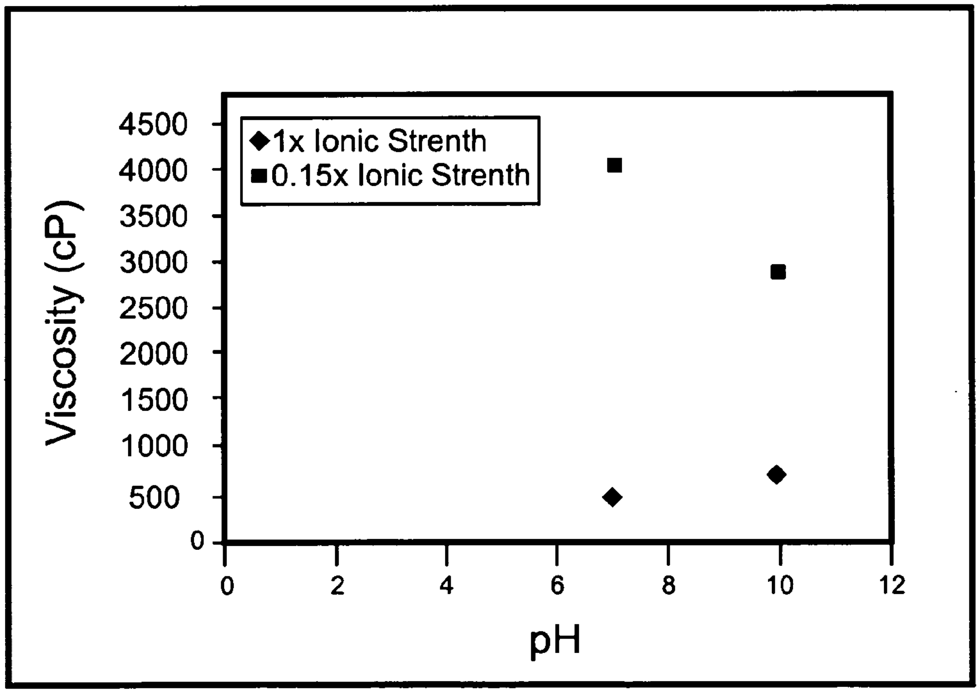
FIG. 4D shows viscosity data of cleaning materials with different pH values and different ionic strengths, in accordance one embodiment of the present invention.

The data in Table IV show that for hydrophobic surfaces, cleaning materials with lower ionic strength and lower pH show better particle adder results. The results in Table III and Table IV show that different substrate surfaces may require different formulations of cleaning materials. The results also indicate that for some applications, low ionic strength could be needed to achieve good cleaning results. These applications may include processes where hydrophobic surfaces are encountered, such as photoresist, poly-silicon, low-k dielectric, or porous low-k dielectric, etc. Since lower ionic strength increase viscosity of cleaning materials, it would be necessary to have a cleaning system and method that work with the cleaning materials described above that have higher viscosity. FIG. 4D shows viscosity data of the cleaning materials described above with different pH values and different ionic strengths, in accordance with one embodiment of the present invention. The data show that lower ionic strength results in higher viscosity. The viscosities of the cleaning materials are measured at 0.1/s shear rate. For example, viscosities measured at less than about 1/s (<1/s) are considered to be measured at low shear rates. At normal ionic strength (1X), the viscosity increases with the pH value of the cleaning material. However, at low ionic strength (0.15X), the viscosity decreases with the pH value.

In one embodiment, the range of low shear viscosity of the cleaning materials with polymers is between 10 cP to about 100,000 cP. In another embodiment, the range of low shear viscosity of the cleaning materials is between about 100 cP to about 10,000 cP. As mentioned above, the process window of viscosities of the cleaning materials can be widened by making changes in equipment design and process conditions. For example, the dispense openings for the cleaning materials can be made larger to allow cleaning materials to be applied (or dispensed) on the substrates at reasonable rates. In addition, the apparatus for delivering and removing the rinse liquid can be designed to allow more rigorous rinsing to shorten the rinse time for cleaning materials with higher viscosities.

Figure 5A:
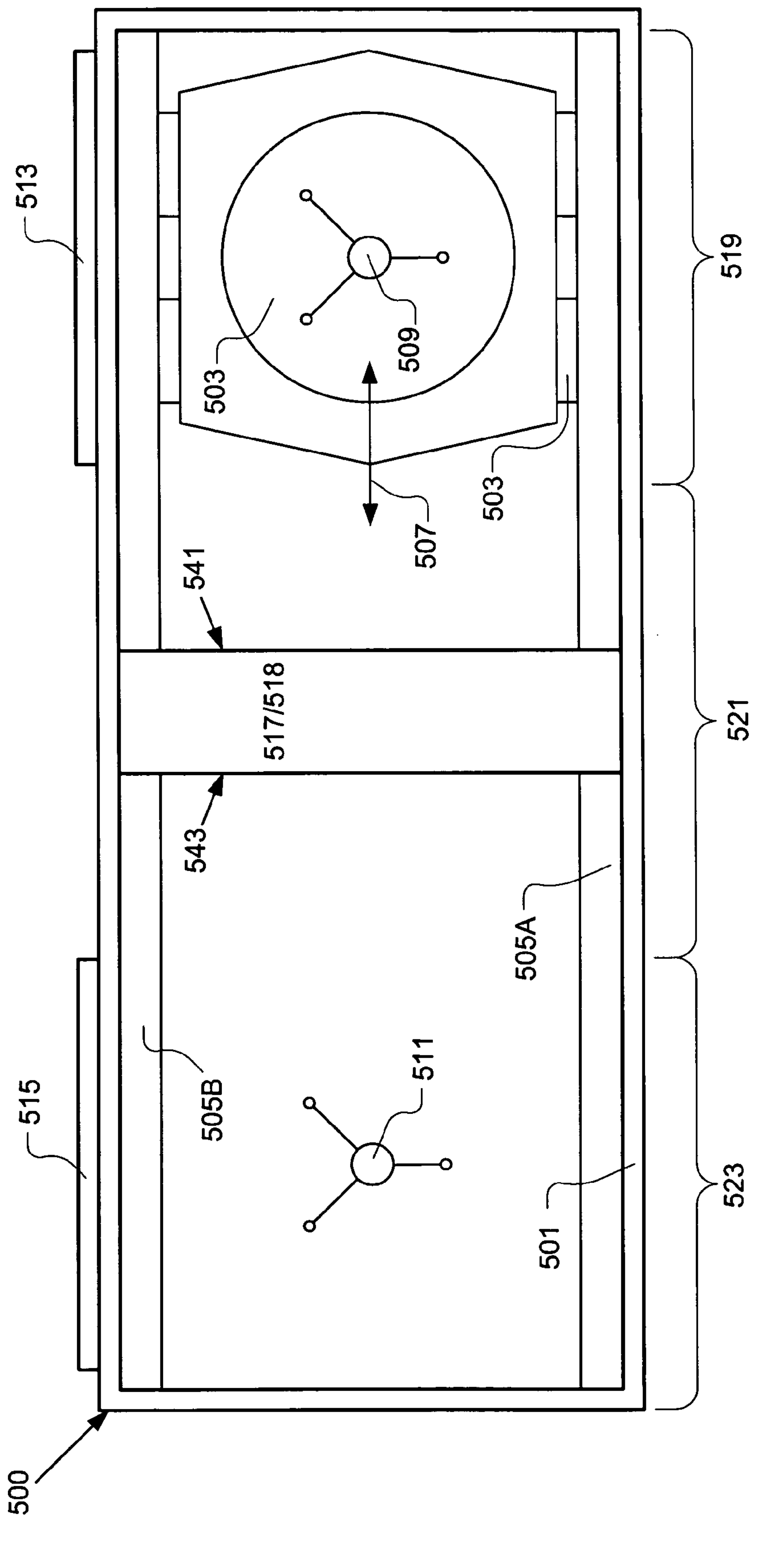
FIG. 5A shows a system for cleaning contaminants from a substrate, in accordance with one embodiment of the present invention.

FIG. 5A shows a system for cleaning contaminants from a substrate, in accordance with one embodiment of the present invention. The system includes a chamber 500 defined by enclosing walls 501. The chamber 500 includes an input module 519, a processing module 521, and an output module 523. A substrate carrier 503 and corresponding drive apparatus is defined to provide linear movement of a substrate 502 from the input module 519, through the processing module 521, to the output module 523, as indicated by arrow 507. A drive rail 505A and a guide rail 505B are defined to provide for controlled linear movement of the substrate carrier 503, such that the substrate 502 is maintained in a substantially horizontal orientation along a linear path defined by the drive rail 5105A and guide rail 505B.

The input module 519 includes a door assembly 513 through which the substrate 502 can be inserted into the chamber 500 by a substrate-handling device. The input module 519 also includes a substrate lifter 509 defined to move vertically through an open region of the substrate carrier 503, when the substrate carrier 503 is centered thereover in the input module 519. The substrate lifter 509 can be raised to receive the substrate 502 when inserted into the chamber 500 through the door assembly 513. The substrate lifter 509 can then be lowered to place the substrate 502 on the substrate carrier 503.

The processing module 521 includes an upper processing head 517 disposed to process a top surface of the substrate 502 as the substrate carrier 503, with the substrate 502 positioned thereon, moves beneath the upper processing head 517. The processing module 521 also includes a lower processing head 518 (see FIG. 5B) disposed below the linear travel path of the substrate carrier 503 opposite the upper processing head 517. The lower processing head 518 is defined and positioned to process a bottom surface of the substrate 502 as the substrate carrier 503 moves through the processing module 521. Each of the upper and lower processing heads 517 and 518 has a leading edge 541 and trailing edge 543, such that during a processing operation the substrate carrier 503 moves the substrate 502 along the linear path from the leading edge 541 toward the trailing edge 543. As discussed in more detail below, with regard to the present invention, each of upper and lower processing heads 517 and 518 are defined to perform a multi-stage cleaning process on the top and bottom surfaces of the substrate 502, respectively.

It should be understood that in some embodiments one or more additional processing heads may be used in conjunction with the upper processing head 517 above the linear travel path of the substrate carrier 503, and/or one or more additional processing heads may be used in conjunction with the lower processing head 518 below the linear travel path of the substrate carrier 503. For example, processing heads defined to perform a drying process on the substrate 502 may be positioned behind the trailing edges of the upper and lower processing heads 517 and 518, respectively.

Once the substrate carrier 503 moves through the processing module 521, the substrate carrier 503 arrives at the output module 515. The output module 515 includes a substrate lifter 511 defined to move vertically through the open region of the substrate carrier 503, when the substrate carrier 503 is centered thereover in the output module 511. The substrate lifter 511 can be raised to lift the substrate 502 from the substrate carrier 503 to a position for retrieval from the chamber 500. The output module 511 also includes a door assembly 515 through which the substrate 502 can be retrieved from the chamber 500 by a substrate-handling device.

Figure 5B:
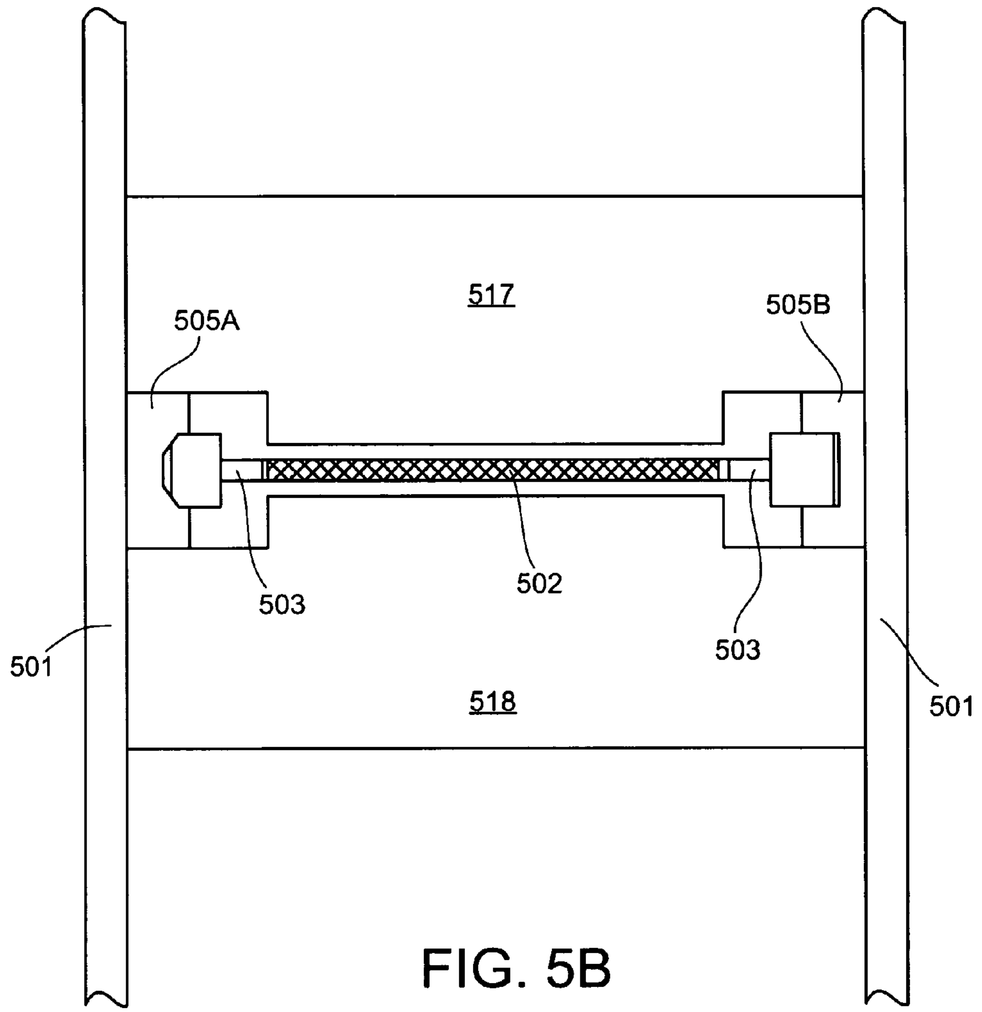
FIG. 5B shows a vertical cross-section view of the chamber with the substrate carrier located beneath the upper processing head and above the lower processing head, in accordance with one embodiment of the present invention.

FIG. 5B shows a vertical cross-section view of the chamber 500 with the substrate carrier 503 located beneath the upper processing head 517 and above the lower processing head 518, in accordance with one embodiment of the present invention. The upper processing head 517 is mounted to both the drive rail 505A and the guide rail 505B, such that a vertical position of the upper processing head 517 is indexed to both a vertical position of the drive rail 505A and a vertical position of the guide rail 505B, and is thereby indexed to a vertical position of the substrate carrier 503 and substrate 502 held thereon.

The upper processing head 517 is defined to perform a cleaning process on the top surface of the substrate 502 as the substrate carrier 503 moves the substrate 502 thereunder. Similarly, the lower processing head 518 is defined to perform a rinsing process on the bottom surface of the substrate 502 as the substrate carrier 503 moves the substrate 502 thereover. In various embodiments, each of the upper and lower processing heads 517 and 518 within the processing module 521 can be defined to perform one or multiple substrate processing operations on the substrate 502. Additionally, in one embodiment, the upper and lower processing heads 517 and 518 within the processing module 521 are defined to span a diameter of the substrate 502, such that one pass of the substrate carrier 503 under/over the upper/lower processing heads 517/518 will process an entirety of the top/bottom surface of the substrate 102.

Figure 5C:
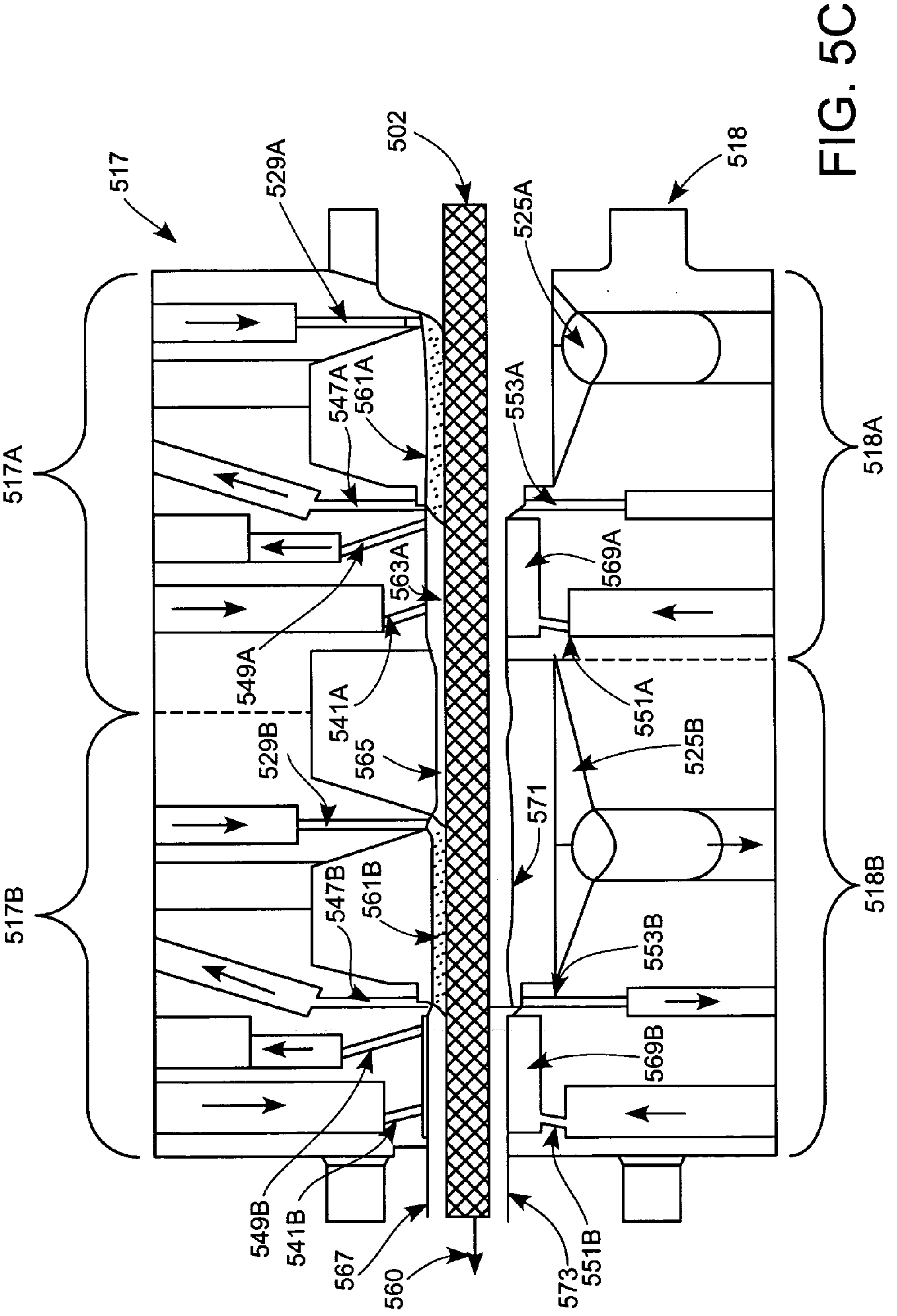
FIG. 5C shows the upper processing head positioned above the substrate with the lower processing head positioned below the substrate opposite the upper processing head, in accordance with one embodiment of the present invention.

FIG. 5C shows a cross-sectional view of the upper processing head 517 positioned above the substrate 502 with the lower processing head 518 positioned below the substrate 502 opposite the upper processing head 517, in accordance with one embodiment of the present invention. The upper processing head 517 includes a first topside module 517A operating to apply a cleaning material 561A through the cleaning material dispense port 529A to the substrate 502. The upper processing head 517 also includes a second topside module 517B operating to apply a cleaning material 561B through the cleaning material dispense port 529B to the substrate 502. The chemical components of the cleaning material 561A can be same or different from those of the cleaning material 561B.

In one embodiment, the cleaning material dispense ports 529A and 529B are long slits along the length of the upper processing head 517.

In each of the first and second topside modules 517A/517B, rinsing material dispense port 541A/541B supply rinsing material on the trailing side of the rinsing meniscus, while a first row of vacuum ports 547A/547B removes fluid on the leading side of the rinsing meniscus. Because the first row of vacuum ports 547A/547B is provided at the leading side of the rinsing meniscus, as opposed to being provided at both the leading and trailing sides, ports within the row of rinsing fluid supply ports 541A/541B are angled downward toward the first row of vacuum ports 547A/547B.

In one embodiment, each of the first and second topside modules 517A/517B includes a second row of vacuum ports 549A/549B defined along a trailing side of the first row of vacuum ports 547A/547B. The second row of vacuum ports 549A/549B is defined to provide multi-phase suction of the cleaning material and the rinsing material from the substrate when present thereunder. The second row of vacuum ports 549A/549B can be controlled independently from the first row of vacuum ports 547A/547B. The ports of the second row of vacuum ports 549A/549B are defined as single phase liquid return ports and are configured to avoid disruption of the rinsing fluid meniscus stability.

The first topside module 517A operates to flow the rinsing material through the topside rinsing meniscus 563A in a substantially unidirectional manner towards the cleaning material 561A and opposite a direction 560 of movement of the substrate 502. A flow rate of rinsing material through the topside rinsing meniscus 563A is set to prevent cleaning material leakage past the topside rinsing meniscus 563A. The first topside module 517A leaves a uniform thin film of rinsing material 565 on the substrate 502.

The second topside module 517B of the upper processing head 517 operates to apply cleaning material 561B to the substrate 502, and then expose the substrate 502 to a topside rinsing meniscus 563B. The second topside module 517B operates to flow the rinsing material through the topside rinsing meniscus 563B in a substantially uni-directional manner towards the cleaning material 561B and opposite the direction 560 of movement of the substrate 502. A flow rate of rinsing material through the topside rinsing meniscus 563B is set to prevent cleaning material leakage past the topside rinsing meniscus 563B. The second topside module 517B leaves a uniform thin film of rinsing material 567 on the substrate 502.

The first bottomside module 518A of the lower processing head 518 operates to apply a bottomside rinsing meniscus 569A to the substrate 502 so as to balance a force applied to the substrate 502 by the topside rinsing meniscus 563A. The first bottomside module 518A operates to flow the rinsing material through the bottomside rinsing meniscus 569A in a substantially uni-directional manner opposite the direction 560 of movement of the substrate 502. The first bottomside module 518A leaves a uniform thin film of rinsing material 571 on the substrate 502.

The second bottomside module 518B of the lower processing head 518 operates to apply a bottomside rinsing meniscus 569B to the substrate 502 so as to balance a force applied to the substrate 502 by the topside rinsing meniscus 563B. The second bottomside module 518B operates to flow the rinsing material through the bottomside rinsing meniscus 569B in a substantially uni-directional manner opposite the direction 560 of movement of the substrate 502. The second bottomside module 518B leaves a uniform thin film of rinsing material 573 on the substrate 502.

Each of the first and second bottomside modules 518A/518B includes a respective row of rinsing material dispense ports 551A/551B defined within the respective rinsing meniscus region 569A/569B. Each row of rinsing material dispense ports 551A/551B is defined to dispense a rinsing material upward onto the substrate when present thereabove.

In one embodiment, the rinsing material is deionized water (DIW). However, in other embodiments, the rinsing material can be one of many different materials in liquid state, such as dimethyl sulfoxide (DMSO), dimethyl formamide (DMF), dimethyl acetate (DMAC), a polar solvent easy mixable with DIW, an atomized liquid such as an atomized polar solvent (e.g., DIW), or any combination thereof. It should be understood that the above-identified rinsing materials are provided by way of example and do not represent an inclusive set of rinsing materials.

Figure 5D:
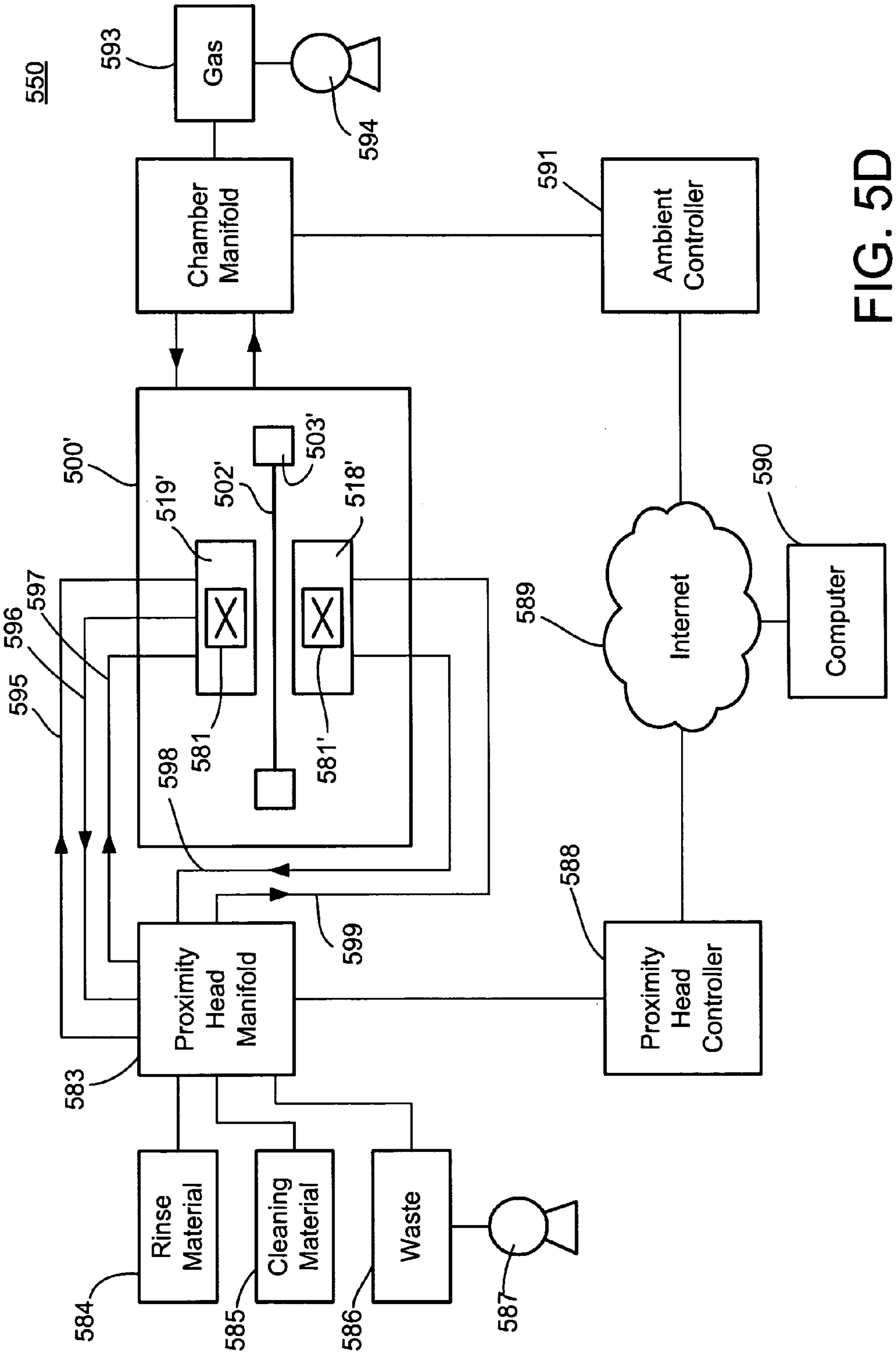
FIG. 5D shows a substrate cleaning system, in accordance with one embodiment of the present invention.

FIG. 5D shows a cleaning system 550 with a substrate cleaning chamber 500', in accordance with one embodiment of the present invention. The substrate cleaning chamber 500' is similar to the chamber 500 described above. In chamber 500' there is a substrate 502' held by a substrate carrier 503'. The substrate cleaning chamber 500' has an upper processing head 517' and a lower processing head 518'. In one embodiment, the upper processing head 517' is held by an arm 581 and the lower processing head 518' is held by an arm 581'. The cleaning material with polymers is supplied to the upper processing head 517 via supply line 595. The rinsing material, such as de-ionized water (DIW) is supplied to the upper processing head via supply line 597. The cleaning waste is removed from the substrate 502' via waste line 596. The rinsing material is supplied to the lower processing head 518' via supply line 599. The rinsing waste is removed via waste line 598. The supply lines 595, 597, 599, and waste lines 596, 598 are coupled to a proximity head manifold 583. The proximity head manifold 583 is also coupled to a container 584 of the rinsing material, a container 585 for the cleaning material, and a waste container 586. The waste container 586 is further coupled to a vacuum pump 587.

The proximity head manifold 583 is coupled to a proximity head controller 588, which is then controlled by a computer 590. An operator can make controlling command via the computer 590. In one embodiment, the proximity head controller 588 is connected to the computer 590 via Internet 589. The ambient of the substrate cleaning chamber 500' can also be controlled. One or more types of gases can be supplied to chamber 500'. For example, a gas tank 593 can be coupled to chamber 500'. The pressure of chamber 500' can also be maintained via a vacuum pump 594. The flow of gas from gas tank 593 and the vacuuming of chamber 500' can be controlled by a chamber manifold 592, which is coupled to an ambient controller 591. The ambient controller 591 can also be coupled to the computer 590.

Additional details of the cleaning apparatus described above can be found in U.S. patent application Ser. No. 12/431,731, filed on Apr. 28, 2009, entitled "Apparatus and System for Cleaning Substrate," and U.S. patent application Ser. No. 12/131,667, filed on Jun. 2, 2008, entitled "Apparatus for Particle Removal by Single-Phase and Two-Phase Media." The disclosure of each of the above-identified related applications is incorporated herein by reference.

Figure 6A:
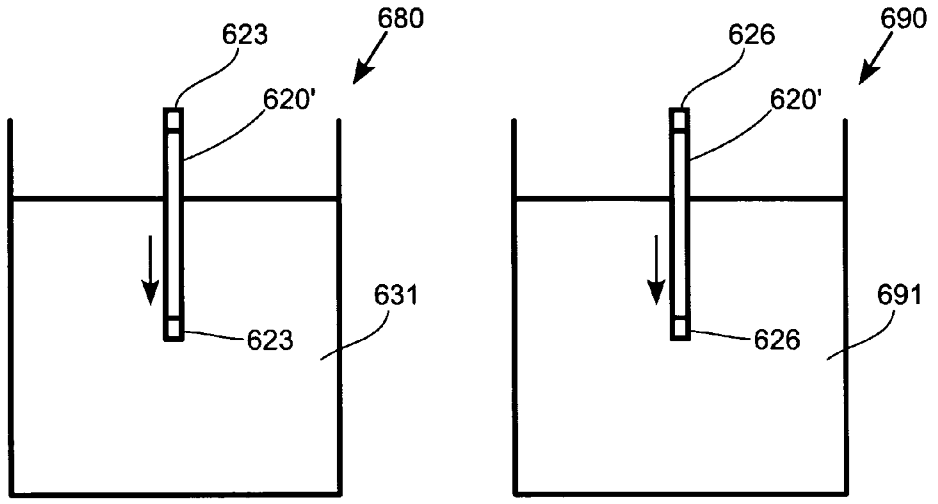
FIG. 6A shows a cleaning apparatus using the cleaning material containing polymers of a polymeric compound with large molecular weight to clean substrates and a rinsing apparatus to rinse off the cleaning material, in accordance with one embodiment of the present invention.

The embodiments described above are merely examples. Other embodiments of cleaning heads for dispensing cleaning material on the substrate surface and for removing cleaning material from the substrate surface are also possible. FIG. 6A shows a cleaning tank 680 containing cleaning material 681 and a rinsing tank 690 containing rinse liquid 691, in accordance with one embodiment of the present invention.

Substrate 620', held by a substrate carrier 623, is first dipped into the cleaning material 481 of tank 680 to allow the cleaning material to be in contact with the contaminants on the substrate surface. Substrate 620' is lowered into and raised out of the cleaning material 681 in cleaning tank 680 by a mechanical mechanism (not shown). Afterwards, the substrate 620', held by a substrate carrier 626, is then dipped into the rinse liquid 691 of cleaning tank 690 to rinse off the cleaning material. A mechanical mechanism (not shown) is used to lower and raise the substrate into and out of the rinse tank 690. When the cleaning material leaves the surface of substrate 620' in rinse tank (or rinsing tank) 690, the contaminants are removed from the substrate surface along with the cleaning material. Substrate 620' is lowered into the rinse liquid 691 in rinse tank 690 by a mechanical mechanism (not shown). Although the orientation of the substrate shown in FIG. 6A is vertical, other orientation is also possible. For example, the substrate can be submerged in the cleaning tank and/or the rinse tank in a horizontal orientation.

Figure 6B:
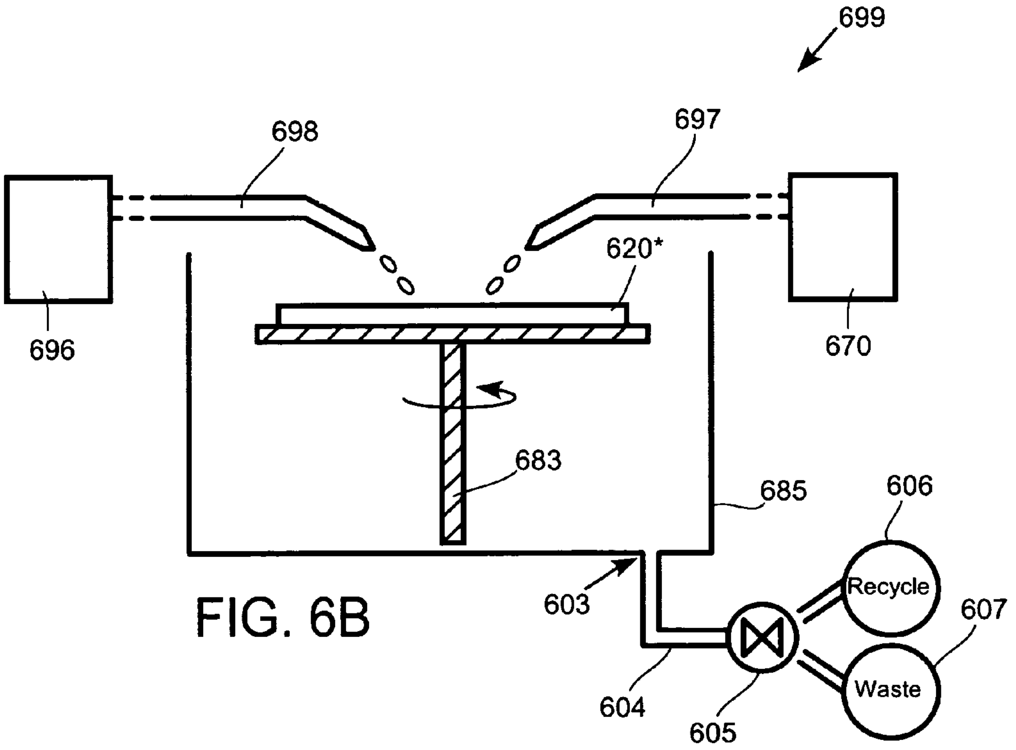
FIG. 6B shows a cleaning and rinsing apparatus using the cleaning material containing polymers of a polymeric compound with large molecular weight to clean substrates, in accordance with one embodiment of the present invention.

FIG. 6B shows another embodiment of a cleaning apparatus 699 for cleaning contaminants from the surface of the substrates. The cleaning apparatus has a cleaning tank 685 with a substrate support 683. Substrate 620* is placed on the substrate support 683, which rotates during the cleaning process. The cleaning apparatus 699 has a cleaning material dispensing head 697, which dispenses cleaning material on the surface of substrate 620*. The cleaning material dispensing head 697 (or a dispensing nozzle) is coupled to a storage tank 670 of cleaning material. The cleaning apparatus 699 also has a rinse liquid dispensing head 698 (or a dispensing nozzle), which sprays rinse liquid on the surface of the substrate 620". The rinse liquid dispensing head 698 is coupled to a storage tank 696 of the rinse liquid. The rotating substrate 620* allows the cleaning material and the rinse liquid to cover the entire substrate surface. The cleaning material is dispensed on the substrate surface before the rinse liquid is dispensed to remove the cleaning material from the substrate surface.

After the cleaning material is rinsed off the surface of the patterned substrate, the patterned substrate is dried by spinning (or rotating) the substrate at a relatively high speed. During the spinning, the substrate is secured by a device (or mechanism), which is not shown in FIG. 6B. In one embodiment, a surface tension reducing gas is applied on the surface of the patterned substrate to assist in removing the rinse and possibly residual cleaning material. In one embodiment, the surface tension reducing gas includes a mixture of isopropyl alcohol (IPA) and nitrogen ($N_2$). Other surface tension reducing gases can also be used.

The cleaning tank 685 can receive waste of the cleaning process. The waste of the cleaning process includes waste cleaning material and waste rinse liquid. In one embodiment, the cleaning tank 685 has a drainage hold 603, which is connected to a waste line 604. Waste line 604 is coupled to a valve 605, which controls the draining of cleaning waste from the cleaning tank 685. The cleaning waste can be directed to a recycling processor 606 or a waste processor 607.

The cleaning materials described above have special advantages in cleaning substrates with fine features (or topologies), such as polysilicon lines or metallic interconnects (with trenches and/or vias), on the substrate surface. The smallest width (or critical dimension) of these fine features can be 45 nm, 32 nm, 22 nm, 16 nm or less.

Figure 7A:
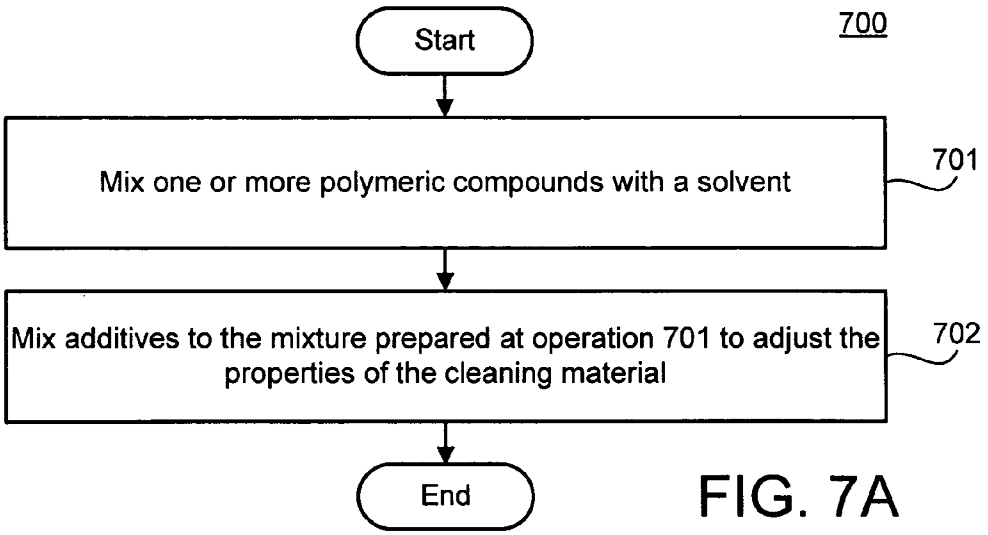
FIG. 7A shows a process flow of preparing a cleaning material containing polymers of one or more polymeric compounds with high molecular weights, in accordance with one embodiment of the present invention.

FIG. 7A shows a process flow 700 of preparing a cleaning material containing one or more polymeric compounds with large molecular weights, in accordance with one embodiment of the present invention. At operation 701, one or more polymeric compounds is mixed with a solvent. In one embodiment, the one or more polymeric compounds are in powder form and the amount is pre-measured. Before the mixing process, the amount of the one or more polymeric compounds is calculated and weighted. Similarly, the amount of solvent used in also measured. At operation 702, additives are mixed in with the mixture prepared at operation 701 to adjust the properties of the prepared cleaning material. The additives may include a buffering agent for adjusting the pH value of the cleaning material. The additives may also include an ion-providing compound for adjusting the viscosity of the cleaning material. Further, the additives may include a surfactant for improving the solubility of the polymeric compounds and/or to assist wetting the surface of the patterned substrate by the cleaning material. Other types of additives can also be included to adjust the properties of the cleaning material.

Using the process flow 700 to prepare a cleaning material, the cleaning material can have a targeted pH value, a targeted viscosity, and other desired properties, such as solubilized polymers and good wetting characteristics. As mentioned above, the operable pH range and viscosity range could be very wide. Alternatively, the mixing of the surfactant, buffering agent, and the ion-providing compound can occur in various sequential steps. In another embodiment, the different ingredients used for preparing the cleaning material can be mixed in one single process step.

Figure 7B:
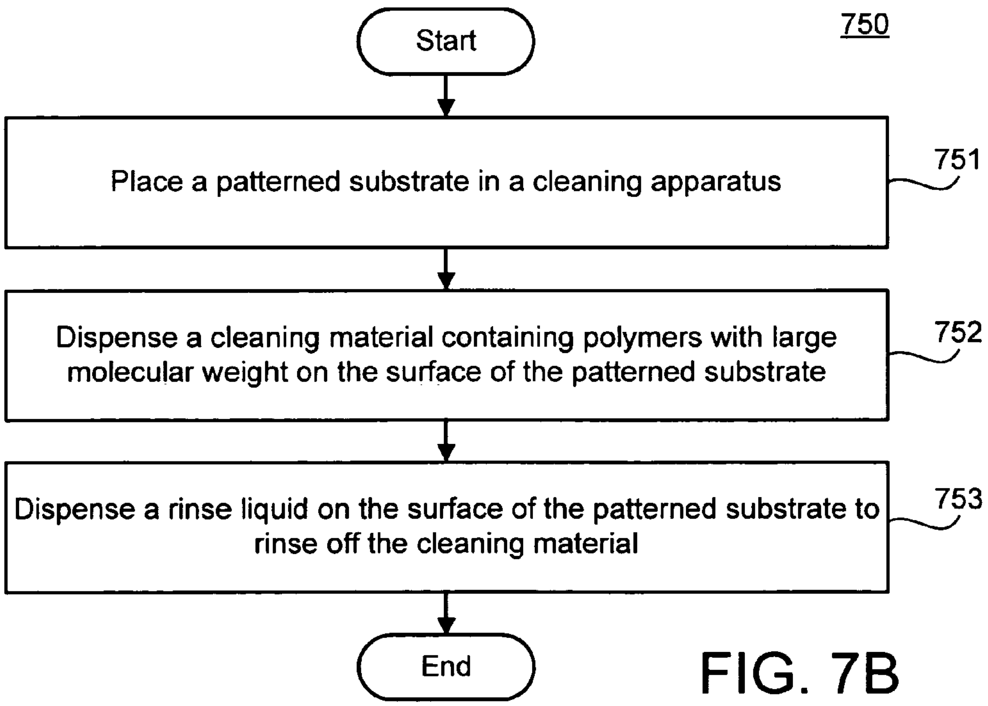
FIG. 7B shows a process flow using the cleaning material containing polymers of one or more polymeric compounds with high molecular weights to clean patterned substrates, in accordance with one embodiment of the present invention.

FIG. 7B shows a process flow 750 of cleaning a patterned substrate using a cleaning material containing one or more polymeric compounds with large molecular weights, in accordance with one embodiment of the present invention. The cleaning material is described above. At step 751, the patterned substrate is place in a cleaning apparatus. At step 752, the cleaning material is dispensed on the surface of the patterned substrate. At step 753, a rinse liquid is dispensed on the surface of the patterned substrate to rinse off the cleaning material. The rinse liquid is described above. In one embodiment, after the rinse liquid is applied on the substrate surface, the rinse liquid, the cleaning material, and the contaminants on the substrate surface can be removed from the surface of the patterned substrate by vacuum.

The cleaning materials, apparatus, and methods discussed above have advantages in cleaning patterned substrates with fine features without damaging the features. The cleaning materials are fluidic, either in liquid phase, or in liquid/gas phase (foam), and deform around device features; therefore, the cleaning materials do not damage the device features. The cleaning materials in the liquid phase can be in the form of a liquid, a sol, or a gel. The cleaning materials containing polymers with large molecular weight(s) capture the contaminants on the substrate. In addition, the cleaning materials entrap the contaminants and prevent the contaminants from returning to the substrate surface. The polymers form long polymer chains, which can also be cross-linked to form a network of polymers. The long polymer chains and/or polymer network show superior capabilities of capturing and entrapping contaminants, in comparison to conventional cleaning materials.

The cleaning material is substantially free of non-deformable particles (or abrasive particles), before it is applied on the substrate surface to remove contaminants or particles from the substrate surface. Non-deformable particles are hard particles, such as particles in a slurry or sand, and can damage fine device features on the patterned substrate. During the substrate cleaning process, the cleaning material would collect contaminants or particles from the substrate surface. However, no non-deformable particles have been intentionally mixed in the cleaning material before the cleaning material is applied on the substrate surface for substrate cleaning.

Although the embodiments above describe materials, methods, and systems for cleaning patterned substrates, the materials, methods, and systems can also be used to clean un-patterned (or blank) substrates.

Although the discussion above is centered on cleaning contaminants from patterned wafers, the cleaning apparatus and methods can also be used to clean contaminants from un-patterned wafers. In addition, the exemplary patterns on the patterned wafers discussed above are protruding lines, such as polysilicon lines, metal lines, or dielectric lines. However, the concept of the present invention can apply to substrates with recessed features. For example, recess trenches or vias after CMP can form a pattern on the wafer and a most suitable design of cleaning head can be used to achieve the best contaminant removal efficiency.

A substrate, as an example used herein, denotes without limitation, semiconductor wafers, hard drive disks, optical discs, glass substrates, flat panel display surfaces, and liquid crystal display surfaces, etc., which may become contaminated during manufacturing or handling operations. Depending on the actual substrate, a surface may become contaminated in different ways, and the acceptable level of contamination is defined in the particular industry in which the substrate is handled.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed is:

1. A cleaning material applied on a surface of a patterned substrate for defining integrated circuit devices to remove contaminants from the surface, comprising:

a solvent;

a buffering agent to change a potential of hydrogen (pH) value of the cleaning material, wherein the buffering agent and the solvent form a cleaning solution, the buffering agent including ammonium hydroxide;

polymers of one or more polymeric compounds, wherein the one or more polymeric compounds are dissolved in the solvent, the solubilized polymers having long polymer chains, which capture and entrap at least some of the contaminants from the surface of the patterned substrate for defining integrated circuit devices, the cleaning material being defined as a liquid phase, wherein the cleaning material deforms around device features on the surface of the patterned substrate when a force is applied on the cleaning material covering the patterned substrate;

a surfactant to assist dispersing the polymers in the cleaning material and to assist wetting the surface of the patterned substrate; and an ion-providing compound, which ionizes in the cleaning solution to provide greater ionic strength to the cleaning material to modify the viscosity of the cleaning material such that the viscosity of the cleaning material is between about 100 cP to about 100,000 cP measured at a reference shear rate less than about 100/s, the ion-providing compound including citric acid;

wherein the cleaning material is applied on the surface of the patterned substrate to remove contaminants from the surface without substantially damaging the device features on the surface, the cleaning material being free of abrasive particles before the cleaning material is applied on the surface of the patterned substrate.

2. The cleaning material of claim 1, wherein the solvent is selected from the group consisting of water, isopropyl alcohol (IPA), dimethyl sulfoxide (DMSO), dimethyl formamide (DMF), or a combination thereof.

3. The cleaning material of claim 1, wherein the one or more polymeric compounds are selected from the group consisting of acrylic polymers, such as polyacrylamide (PAM), polyacrylic acid (PAA), such as Carbopol 940™ and Carbopol 941™, copolymers of PAM and PAA, poly-(N,N-dimethyl-acrylamide) (PDMAAm), poly-(N-isopropyl-acrylamide) (PIPAAm), polymethacrylic acid (PMAA), polymethacrylamide (PMAAm), polyimines and oxides, such as polyethylene imine (PEI), polyethylene oxide (PEO), polypropylene oxide (PPO), vinyl polymers, such as polyvinyl alcohol (PVA), polyethylene sulphonic acid (PESA), polyvinylamine (PVAm), polyvinyl-pyrrolidone (PVP), poly-4-vinyl pyridine (P4VP), cellulose derivatives, such as methyl cellulose (MC), ethyl-cellulose (EC), hydroxyethyl cellulose (HEC), carboxymethyl cellulose (CMC), polysaccharides, such as acacia, agar and agarose, heparin, guar gum, xanthan gum, and proteins such as albumen, collagen, and gluten.

4. The cleaning material of claim 1, wherein the molecular weights of the one or more polymeric compounds are between about 1M g/mol to about 100M g/mol.

5. The cleaning material of claim 1, wherein the weight percent of the polymers in the cleaning material is between about 0.001% to about 10%.

6. The cleaning material of claim 1, wherein the surfactant is ammonium dodecyl sulfate (ADS).

7. The cleaning material of claim 1, wherein the cleaning material is fluidic in a form of a liquid, sol, or gel.

8. The cleaning material of claim 1, wherein the pH value of the cleaning material is between about 1 and about 12 for front-end and backend applications.

9. The cleaning material of claim 1, wherein the viscosity of the cleaning material is between about 100 cP to about 10,000 cP measured at the reference shear rate.

10. The cleaning material of claim 1, where the device feature sizes having a critical dimension less than or equal to about 45 nm.

11. The cleaning material of claim 1, wherein part of the long polymer chains is cross-linked to form a polymeric network, which assists in capturing and entrapping the contaminants.

12. The cleaning material of claim 1, wherein the one or more polymeric compounds include polyacrylamide (PAM) and the molecular weight of PAM is greater than or equal to 1,000,000 g/mol.

13. The cleaning material of claim 1, wherein the one or more polymeric compounds include copolymers of acrylamide and acrylic acid, and wherein the weight percentage of acrylic acid in the copolymers is less than about 50%.

14. The cleaning material of claim 1, wherein the reference shear rate is less than about 1/s.

15. A cleaning material applied on a surface of a patterned substrate for defining integrated circuit devices to remove contaminants from the surface, comprising:

a solvent;

a buffering agent to change a potential of hydrogen (pH) value of the cleaning material, wherein the buffering agent and the solvent form a cleaning solution, the buffering agent including ammonium hydroxide;

polymers of one or more polymeric compounds being dissolved in the cleaning solution, the cleaning material having the pH between about 7 and about 12, the solubilized polymers having long polymer chains to capture and entrap at least some of the contaminants from the surface of the patterned substrate for defining integrated circuit devices, the cleaning material being defined as a liquid phase, wherein the cleaning material deforms around device features on the surface of the patterned substrate when a force is applied on the cleaning material covering the patterned substrate, wherein the molecular weights of the one or more polymeric compounds are between about 15M g/mol to about 100M g/mol;

a surfactant to assist dispersing the polymers in the cleaning material and to assist wetting the surface of the patterned substrate; and an ion-providing compound, which ionizes in the cleaning solution to adjust the viscosity of the cleaning material such that the viscosity of the cleaning material is between about 100 cP to about 100,000 cP measured at a reference shear rate, the ion-providing compound including citric acid;

wherein the cleaning material is applied on the surface of the patterned substrate to remove contaminants from the surface without substantially damaging the device features on the surface, the cleaning material being free of abrasive particles before the cleaning material is applied on the surface of the patterned substrate.

* * * * *

UNITED STATES PATENT AND TRADEMARK OFFICE

CERTIFICATE OF CORRECTION

PATENT NO. : 8,314,055 B2
APPLICATION NO. : 12/503486
DATED : November 20, 2012
INVENTOR(S) : David S. L. Mui et al.

It is certified that error appears in the above-identified patent and that said Letters Patent is hereby corrected as shown below:

On the title page, replace item (63) as follows:

Continuation-in-part of application No. 12/131,654, filed on Mar. 2, 2008, now Pat. No. 8,211,846.
Continuation-in-part of application No. 12/131,667, filed on Jun. 2, 2008, now Pat. No. 8,084,406.

Signed and Sealed this
Eleventh Day of June, 2013

Teresa Stanek Rea
*Acting Director of the United States Patent and Trademark Office*